US012074130B2

United States Patent
Akejima

(10) Patent No.: US 12,074,130 B2
(45) Date of Patent: Aug. 27, 2024

(54) ELECTRONIC CIRCUIT DEVICE

(71) Applicant: RISING TECHNOLOGIES CO., LTD., Yokohama (JP)

(72) Inventor: Shuzo Akejima, Yokohama (JP)

(73) Assignee: RISING TECHNOLOGIES CO., LTD., Yokohama (JP)

( * ) Notice: Subject to any disclaimer, the term of this patent is extended or adjusted under 35 U.S.C. 154(b) by 359 days.

(21) Appl. No.: 17/534,238

(22) Filed: Nov. 23, 2021

(65) Prior Publication Data

US 2022/0084974 A1  Mar. 17, 2022

Related U.S. Application Data

(63) Continuation of application No. PCT/JP2020/022096, filed on Jun. 4, 2020.

(30) Foreign Application Priority Data

Jun. 10, 2019  (JP) .................. 2019-108186

(51) Int. Cl.
*H01L 23/00* (2006.01)
*H01L 23/488* (2006.01)
*H01L 23/552* (2006.01)

(52) U.S. Cl.
CPC ............ *H01L 24/24* (2013.01); *H01L 23/488* (2013.01); *H01L 23/552* (2013.01); *H01L 24/19* (2013.01);
(Continued)

(58) Field of Classification Search
CPC ..... H01L 24/24; H01L 23/488; H01L 23/552; H01L 24/19; H01L 24/25; H01L 24/82
See application file for complete search history.

(56) References Cited

U.S. PATENT DOCUMENTS 5,111,278 A  5/1992 Eichelberger
6,803,324 B2  10/2004 Ogawa et al.
(Continued)

FOREIGN PATENT DOCUMENTS

CN  108780791 A  11/2018
EP  3339023 A1  6/2018
(Continued)

OTHER PUBLICATIONS

Office Action dated Sep. 6, 2022 issued in JP Appl. No. 2019-076624. [NO18P047-OA1]. English machine translation attached.
(Continued)

*Primary Examiner* — Nathan W Ha
(74) *Attorney, Agent, or Firm* — Franklin & Associates International Inc; Matthew Lambrinos

(57) ABSTRACT

An electronic circuit device includes a plane-shaped shield member having conductivity, at least one electronic circuit element having a first surface opposed to a second surface on which a connecting part is formed, the first surface arranged on the plane-shaped shield member, a rewiring layer comprises an insulating photosensitive resin layer enclosing the electronic circuit element on the plane-shaped shield member, a plurality of wiring photo vias having a plurality of first conductors electrically connected to a connecting part of the electronic element, a wiring having a second conductor electrically connected to each of the plurality of wiring photo vias on the same surface parallel to the plane-shaped shield member, and a wall-shaped shield groove having a third conductor for a sealing arranged to surround a thickness direction of the electronic circuit element.

18 Claims, 24 Drawing Sheets

(52) U.S. Cl.
CPC .............. *H01L 24/25* (2013.01); *H01L 24/82* (2013.01); *H01L 24/73* (2013.01); *H01L 2224/24105* (2013.01); *H01L 2224/24137* (2013.01); *H01L 2224/24146* (2013.01); *H01L 2224/24226* (2013.01); *H01L 2224/24265* (2013.01); *H01L 2224/25171* (2013.01); *H01L 2224/73267* (2013.01); *H01L 2224/82106* (2013.01)

(56) References Cited

U.S. PATENT DOCUMENTS

| | | | |
|---|---|---|---|
| 7,514,636 | B2 | 4/2009 | Sasaki |
| 7,633,765 | B1* | 12/2009 | Scanlan .............. H01L 23/5389 174/262 |
| 8,093,691 | B1* | 1/2012 | Fuentes ................... H01L 24/97 257/659 |
| 8,410,614 | B2 | 4/2013 | Kunimoto |
| 8,643,164 | B2 | 2/2014 | Kaufmann et al. |
| 9,318,429 | B2 | 4/2016 | Hu et al. |
| 9,595,482 | B2* | 3/2017 | Chen .................... H01L 23/481 |
| 9,953,913 | B1* | 4/2018 | Gowda ................ H01L 23/3121 |
| 9,953,917 | B1* | 4/2018 | Gowda ................ H01L 23/5228 |
| 10,074,615 | B1* | 9/2018 | Tseng ................. H01L 21/0201 |
| 10,177,058 | B1* | 1/2019 | Wang .................. H01L 21/4846 |
| 10,354,964 | B2* | 7/2019 | Yu ......................... H01L 21/565 |
| 10,607,945 | B1* | 3/2020 | Lee ....................... H01L 23/552 |
| 11,557,542 | B2* | 1/2023 | Akejima ........... H01L 23/49827 |
| 11,696,400 | B2* | 7/2023 | Akejima .............. H05K 3/4661 174/261 |
| 2001/0010627 | A1 | 8/2001 | Akagawa |
| 2005/0017346 | A1* | 1/2005 | Yamagata ................ H01L 24/82 257/E23.179 |
| 2007/0052067 | A1 | 3/2007 | Umemoto |
| 2007/0069375 | A1* | 3/2007 | Sugimoto ............... H01L 24/24 257/E25.031 |
| 2007/0153491 | A1* | 7/2007 | Lee ....................... H01L 23/552 257/E25.031 |
| 2008/0246126 | A1* | 10/2008 | Bowles ................... H01L 25/50 257/659 |
| 2008/0311682 | A1* | 12/2008 | Adlerstein .............. H01L 23/66 257/E23.114 |
| 2009/0000114 | A1* | 1/2009 | Rao ......................... H01L 24/97 361/767 |
| 2010/0213599 | A1* | 8/2010 | Watanabe ............... H01L 24/24 257/E23.068 |
| 2010/0290191 | A1* | 11/2010 | Lin ......................... H01L 24/82 361/764 |
| 2011/0037165 | A1* | 2/2011 | Oh ........................ H01L 23/528 438/122 |
| 2011/0220169 | A1 | 9/2011 | Okawara et al. |
| 2011/0221069 | A1 | 9/2011 | Kunimoto |
| 2011/0229708 | A1* | 9/2011 | Asami ..................... H01L 24/97 428/316.6 |
| 2012/0020039 | A1* | 1/2012 | Coffy ..................... H01L 25/16 29/829 |
| 2012/0056223 | A1* | 3/2012 | Hsieh ..................... H01L 24/24 257/E33.056 |
| 2012/0300425 | A1 | 11/2012 | Nakashima et al. |
| 2013/0026650 | A1 | 1/2013 | Yamagata et al. |
| 2013/0119562 | A1 | 5/2013 | Shimizu et al. |
| 2013/0157419 | A1 | 6/2013 | Shimizu et al. |
| 2014/0091440 | A1* | 4/2014 | Nair ......................... H01L 24/24 257/659 |
| 2014/0360765 | A1 | 12/2014 | Kiwanami et al. |
| 2015/0016079 | A1 | 1/2015 | Furutani et al. |
| 2015/0179616 | A1* | 6/2015 | Lin ..................... H01L 23/3121 257/773 |
| 2015/0194388 | A1* | 7/2015 | Pabst .................... H01L 21/768 257/659 |
| 2015/0259194 | A1 | 9/2015 | Lin et al. |
| 2015/0279789 | A1* | 10/2015 | Mahajan ............... H01L 23/552 257/659 |
| 2016/0254236 | A1* | 9/2016 | Kim ......................... H01L 23/60 257/659 |
| 2016/0254338 | A1* | 9/2016 | Lin ................... H01L 29/78603 257/40 |
| 2016/0276307 | A1 | 9/2016 | Lin |
| 2017/0025380 | A1 | 1/2017 | Zhai et al. |
| 2017/0287874 | A1 | 10/2017 | Fang et al. |
| 2018/0053719 | A1* | 2/2018 | Kim .................. H01L 23/53209 |
| 2018/0053732 | A1* | 2/2018 | Baek .................. H01L 23/5389 |
| 2018/0068983 | A1* | 3/2018 | Chang ................ H01L 21/6835 |
| 2018/0077829 | A1* | 3/2018 | Yamamoto ............. B32B 15/08 |
| 2018/0130745 | A1 | 5/2018 | Hu et al. |
| 2018/0138130 | A1* | 5/2018 | Lin ........................ H01L 24/16 |
| 2018/0151510 | A1* | 5/2018 | Wu ........................ H01L 21/78 |
| 2018/0286817 | A1* | 10/2018 | Kitazaki ................. H01L 21/78 |
| 2019/0036232 | A1* | 1/2019 | Kang ................... H01L 23/3121 |
| 2019/0043835 | A1 | 2/2019 | Lee et al. |
| 2019/0164904 | A1* | 5/2019 | Katsumata ........... H01L 21/486 |
| 2019/0181126 | A1* | 6/2019 | Cheah ................... H01L 23/552 |
| 2019/0189599 | A1* | 6/2019 | Baloglu .............. H01L 21/4857 |
| 2019/0198450 | A1* | 6/2019 | Lee ......................... H01L 24/73 |
| 2019/0207304 | A1* | 7/2019 | Kim ........................ H01L 24/25 |
| 2019/0229101 | A1* | 7/2019 | Lee ..................... H01L 21/6835 |
| 2019/0237406 | A1* | 8/2019 | Choi ..................... H01L 23/5383 |
| 2019/0287818 | A1* | 9/2019 | Huemoeller .......... H01L 23/552 |
| 2019/0341353 | A1* | 11/2019 | Han ...................... H01L 23/562 |
| 2019/0378801 | A1 | 12/2019 | Leitgeb et al. |
| 2020/0035607 | A1* | 1/2020 | Lee ......................... H01L 24/09 |
| 2020/0083176 | A1* | 3/2020 | Lim ........................ H01L 24/20 |
| 2020/0105689 | A1* | 4/2020 | Hwang ............. H01L 23/49534 |
| 2020/0135669 | A1* | 4/2020 | Liang .................... H01L 24/20 |
| 2020/0203287 | A1* | 6/2020 | Krefft ................. H01L 21/4814 |
| 2020/0350260 | A1* | 11/2020 | Patil .................. H01L 23/49822 |
| 2021/0005555 | A1 | 1/2021 | Akejima |
| 2021/0082828 | A1 | 3/2021 | Akejima |
| 2021/0084762 | A1 | 3/2021 | Akejima |

FOREIGN PATENT DOCUMENTS

| | | |
|---|---|---|
| JP | H11233678 A | 8/1999 |
| JP | 2005183548 A | 7/2005 |
| JP | 2007067216 A | 3/2007 |
| JP | 2010219489 A | 9/2010 |
| JP | 2011187800 A | 9/2011 |
| JP | 2013030593 A | 2/2013 |
| JP | 2013128060 A | 6/2013 |
| JP | 2013236105 A | 11/2013 |
| JP | 2015056458 A | 3/2015 |
| JP | 2015213201 A | 11/2015 |
| JP | 2019033245 A | 2/2019 |
| TW | I606563 B | 11/2017 |
| WO | 2010101163 A1 | 9/2010 |
| WO | 2019049899 A1 | 3/2019 |
| WO | 2020208984 A1 | 10/2020 |
| WO | 2020230442 A1 | 11/2020 |
| WO | 2020250795 A1 | 12/2020 |

OTHER PUBLICATIONS

Chien-Fu Tseng, Chung-Shi Liu, Chi-Hsi Wu, and Douglas Yu, "InFO (Wafer Level Integrated Fan-Out) Technology", 2016 IEEE 66th Electronic Components and Technology Conference, USA, Electronic Components and Technology Conference, 2016, DOI 10.1109/ECTC.2016.65, Cited in specification of PCT/JP2020/022096 [NO19I005].

Masaaki Ishida et al., "Electromagnetic Shielding Technologies for Semiconductor Packages" Toshiba review, pp. 7-10, vol. 2, 2012., Cited in specification of PCT/JP2020/022096 [NO19I005]. English machine translation attached.

Sheng-Chi Hsieh, Fu-Cheng Chu, Cheng-Yu Ho and Chen-Chao Wang, "Advanced Thin-Profile Fan-Out with Beamforming Verification for 5G WidebandAntenna", 2019 IEEE 69th Electronic Components and Technology Conference, USA, Electronic Components and Technology Conference, 2019, DOI 10.1109/ECTC. 2019.00153., Cited in specification of PCT/JP2020/022096 [NO19I005].

ISR (ISA210) dated Sep. 8, 2020 issued in PCT/JP2020/022096. [NO19I005], English translation attached.

(56) References Cited

OTHER PUBLICATIONS

WO-ISA (ISA237) dated Sep. 8, 2020 issued in PCT/JP2020/022096. [NO19l005], English machine translation attached.
ISR (ISA210) dated Oct. 30, 2018 issued in PCT/JP2018/032904 [NO17l033]., English translation attached.
WO-ISA (ISA237) dated Oct. 30, 2018 issued in PCT/JP2018/032904 [NO17l033]., English translation attached.
ISR (ISA210) dated Jun. 23, 2020 issued in PCT/JP2020/009810 [NO18l047]., English translation attached.
WO-ISA (ISA237) dated Jun. 23, 2020 issued in PCT/JP2020/009810 [NO18l047]., English translation attached.
ISR (ISA210) dated May 26, 2020 issued in PCT/JP2020/011640 [NO18l069], English translation attached.
WO-ISA (ISA237) dated May 26, 2020 issued in PCT/JP2020/011640 [NO18l069]., English translation attached.
Office Action dated Jan. 14, 2021 issued in TW Appl. No. 109112166. [NO18P047TW-OA1], English translation attached.
Office Action dated Apr. 19, 2021 issued in Co-pending U.S. Appl. No. 16/812,268. [NO17l033US-OA1].
Notice of Allowance dated Oct. 19, 2021 issued in Co-pending U.S. Appl. No. 17/107,596. [NO18l047US-NOA].
Office Action dated Jan. 24, 2022 issued in TW Appl. No. 107131562. [NO17P033TWOA1]. English translation attached.
Partial ESR dated Mar. 2, 2023 issued in EP Appl. No. 20786901.7. [NO18P047EP-Partial-ESR].
Office Action dated Mar. 28, 2023 issued in JP Appl. No. 2019-076624. [NO18P047-OA2]. English machine translation attached.
Office Action dated Mar. 29, 2023 issued in CN Appl. No. 201880058473.3. [NO17l033CN-OA1]. English machine translation attached.
Office Action dated Jan. 14, 2022 issued in Co-pending U.S. Appl. No. 17/107,806. [NO18l069US-OA1].
Notice of Allowance dated Apr. 21, 2023 issued in Co-pending U.S. Appl. No. 17/665,556. [NO18l047USCA1-NOA].

* cited by examiner

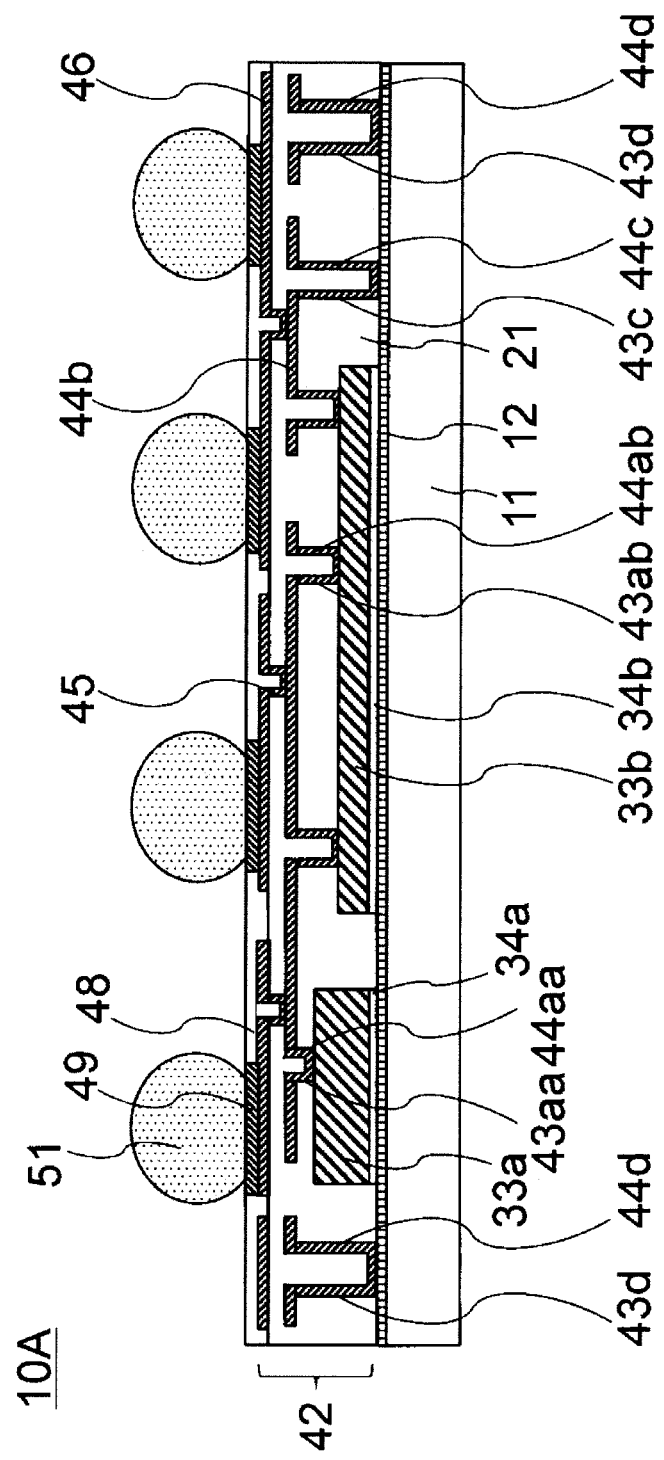

ELECTRONIC CIRCUIT DEVICE

CROSS REFERENCE TO RELATED APPLICATIONS

This application is based upon and claims the benefit of priority from the prior Japanese Patent Application No. 2019-108186 filed on Jun. 10, 2019, and PCT Application No. PCT/JP2020/022096, filed on Jun. 4, 2020, the entire contents of which are incorporated herein by reference.

FIELD

The present invention relates to an electronic circuit device having an electromagnetic wave shield structure, and more particularly, to an electronic circuit device that can be realized at a low cost using a fan-out wafer-level package (FOWLP).

BACKGROUND

A wafer-level package (WLP) with a surface area equivalent to that of a semiconductor integrated circuit element (referred to as a semiconductor chip) with an advanced integrated circuit and FOWLP with a large number of external connection terminals by making them larger than the surface area of the semiconductor chip have been commercialized. In a case where an electromagnetic wave shield structure is applied to a FOWLP called a Face-Down type or a Face-Up type, the top surface and the side surface other than a surface on which a connecting terminal of an individualized package is formed is covered with a metal film by a sputtering process or the like or enclosed in a metal case prepared in advance.

On the other hand, a package called a multi-chip package (MCP) has been put into practical use as a memory package. As a typical MCP, a memory controller chip and a plurality of memory chips (silicon die shapes) are stacked on a wiring substrate in a staircase manner, making a terminal connection of the chip and the wiring substrate with a bonding wire, and the whole being resin-sealed is mounted on a mobile terminals and the like. FIG. 16 shows a schematic diagram thereof. In the MCP 100, a semiconductor chip 102$x$ is Face-Down connected on a wiring substrate 104 prepared in advance, and semiconductor chips 102$y$ and 102$z$ are stacked in a staircase pattern on the semiconductor chip 102$x$ so as to be a Face-Up. Since a plurality of connecting terminals of the surface of the integrated circuits of the semiconductor chips 102$y$ and 102$z$ are exposed, each of the exposed connecting terminals makes a connection between the semiconductor chips 102$y$ and 102$z$ (102$a$), and a connection between the semiconductor chip 102$y$ and the wiring substrate 104 (102$b$) by a wire bonding processing. Thereafter, it is molded with a mold resin 103 to cover the entire semiconductor chips 102$x$ to $z$, and the surface of the mold resin is covered with a metal film by sputtering process, thereby realizing an electromagnetic wave shield structure. The wiring substrate 104 is a multi-layer wiring substrate having a wiring 105 and a wiring via 106 therein. An insulating layer 107 is formed on the back surface of the wiring substrate 104 to cover other than the external connection terminal parts, and solder balls 108 are formed on the external connection terminal parts.

SUMMARY

An electronic circuit device according to an embodiment of the present invention includes a plane-shaped shield member having conductivity, at least one electronic circuit element having a first surface opposed to a second surface on which a connecting part is formed, the first surface arranged on the plane-shaped shield member, and a rewiring layer including an insulating photosensitive resin layer enclosing the electronic circuit element on the plane-shaped shield member, a plurality of wiring photo vias made from a plurality of first conductors electrically connected to a connecting part of the electronic circuit element, a wiring made from a second conductor electrically connected to each of the plurality of wiring photo vias on a same surface parallel to the plane-shaped shield member, and a wall-shaped shield groove made from a third conductor for a sealing arranged to surround a thickness direction of the electronic circuit element. The plurality of first conductors, the second conductor, and the third conductor are formed simultaneously. The plane-shaped shield member and the wall-shaped groove are electrically connected to provide an electromagnetic wave shield structure that surrounds the electronic circuit element.

BRIEF DESCRIPTION OF THE DRAWINGS

FIG. 10 is a cross-sectional view of a semiconductor device according to an embodiment of the present invention;

DESCRIPTION OF THE EMBODIMENTS

Figure 1:
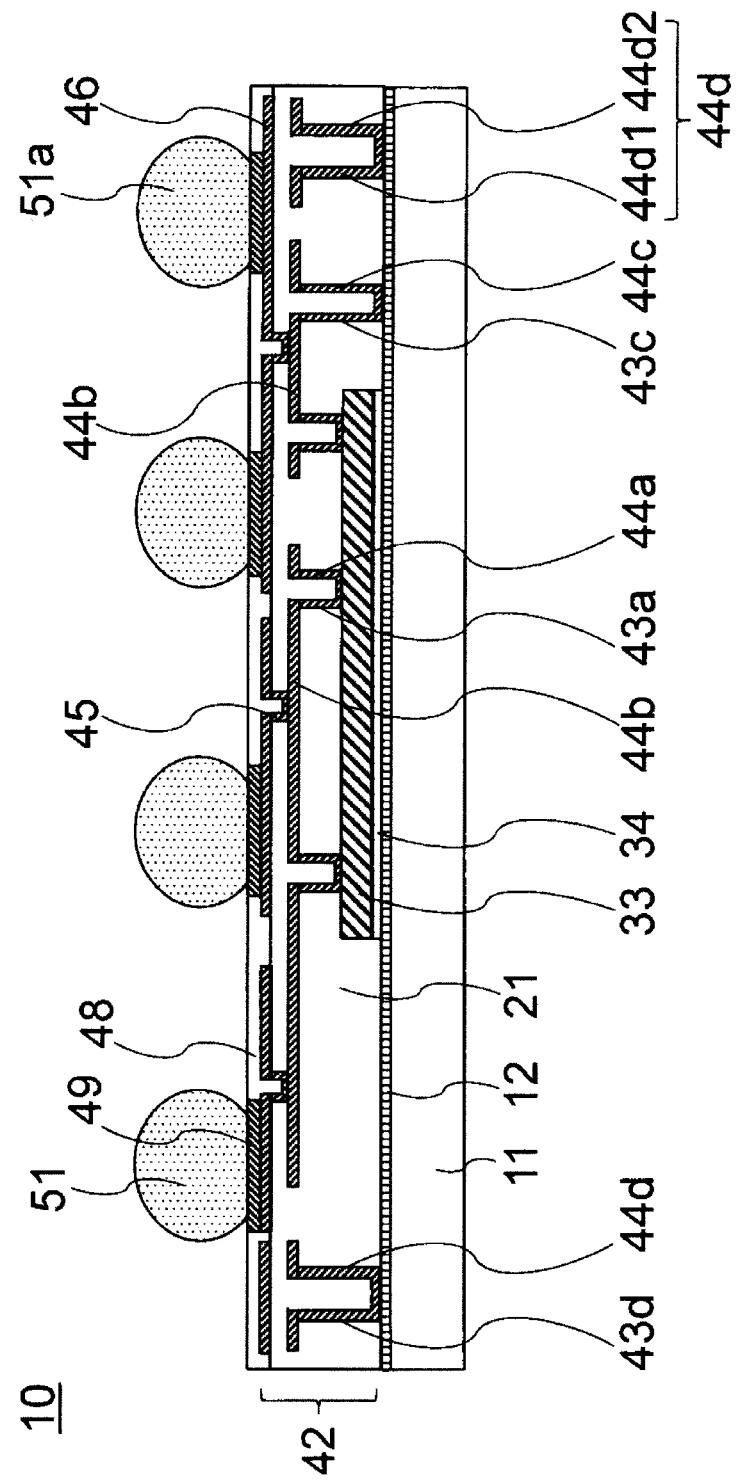
FIG. 1 is a cross-sectional view of a semiconductor device according to an embodiment of the present invention.

Hereinafter, an electronic circuit device according to an embodiment of the present invention and a method for manufacturing thereof will be described with reference to drawings. An example of a semiconductor device using a semiconductor chip such as an application processor chip as an electronic circuit element is shown here. The electronic circuit device, the methods for manufacturing support members of the electronic circuit device and the electronic circuit device can be carried out in many different ways and should not be construed as being limited to the description of the following embodiments. Although the drawings attached to this specification may be schematically represented in terms of the width, thickness, shape, etc. of each part as compared with actual embodiments for the sake of clarity of description, this is merely an example and does not limit the content of the present invention. In the present invention, when a specific component described in one drawing and a specific element described in another drawing are in the same or corresponding relation, the same reference numerals (or reference numerals denoted by a, b, or the like) are given, and repeated description thereof may be omitted as appropriate.

In the MCP 100 of the above-described configuration and in a typical WLP or FOWLP, since the package is once completed by a resin mold and then the processing of covering the part other than the connecting surface with a metal film is performed for an electromagnetic wave shield, the number of manufacturing processes is increased, and an inexpensive package cannot be provided. In addition, since the metal film for the electromagnetic wave shield is formed on the surface of the three-dimensional package, it is not easy to maintain the quality.

To solve the above problems, the present invention aims to provide an electronic circuit device that can be inexpensively realized with a reliable electromagnetic wave shield function using a FOWLP structure suitable for system integration of the semiconductor chip.

FIG. 1 is a cross-sectional view of a semiconductor device which is an electronic circuit device according to an embodiment of the present invention. A large number of these semiconductor devices 10 are formed in the shape of temporary wafer or temporary panel, that is, the left and right ends in the drawing are connected to the semiconductor device 10 of the same configuration, and are individualized in a later process.

The semiconductor device 10 includes a base substrate 11 having a metal film 12 formed on one surface thereof, an application processor chip (semiconductor chip) 33 mounted on the metal film 12 in a Face-Up manner, and a rewiring layer 42. The rewiring layer 42 includes a film-like photosensitive resin layer 21 embedding the semiconductor chip 33. The thickness of the semiconductor chip 33 is about 70 µm, and the thickness of the photosensitive resin layer 21 is about 100 µm. The metal film 12 is a horizontal shield body, and the thickness of the metal film 12 is determined by a design considering the electromagnetic wave to be shielded and the material of the metal film 12.

As shown in FIG. 1, in the present embodiment, the base substrate 11 is made of a rigid substrate such as a glass, plastic, silicon, metal, and the like. The base substrate 11 has a circular or rectangular shape of 0.5 inches to 12 inches in a plan view. In a manufacturing process based on the semiconductor wafer size, it is typically a 12-inch circle. Since the semiconductor chip 33 has a rectangular shape of several millimeters to several centimeters square, several tens to several thousands of semiconductor chips 33 are simultaneously packaged on one base substrate 11. In order to make a large number of packages (individual pieces) at the same time, a manufacturing process using a rectangular liquid crystal substrate size with a long side of 12 inches or more is also possible.

The metal film 12 is formed on one surface of the support plate by a copper plating method. First, a titanium (Ti)/copper (Cu) stacked thin film serving as a seed of copper plating is formed on the entire surface of the substrate by sputtering, then the formed titanium/copper stacked thin film is used as a seed and subjected to copper plating to form the metal film 12 which is a copper film. Although the thickness of the metal film 12 is about 2 µm to 10 µm, it does not interfere with the usual electromagnetic wave shield characteristics and is determined by the shield design. In addition to forming the metal film by the copper plating method, a thick copper film of several tens of micrometers or more may be formed on the substrate by bonding or coating.

In this embodiment, although a configuration in which the base substrate 11 is composed of the metal film 12 formed on one surface of the substrate, it may be composed only of the metal film 12 having sufficient hardness. Further, it is also possible to ground from the top surface of the packaged semiconductor device by forming the metal film 12 on one surface of the base substrate 11 in the same manner as in the present embodiment, forming a ground pad made of a large metal film for grounding that is electrically connected to the metal film 12 on the other surface via a plurality of connecting vias (pre-formed by laser processing, metalizing processing), and grounding for the electromagnetic wave shield through this ground pad. It is also possible to enhance the heat dissipation effect through the ground pad with or without grounding from the top surface via such a grounding pad.

The semiconductor chip 33 is fixed on the metal film 12 of the base substrate 11 via an adhesive layer 34 in a Face-Up manner so that the circuit forming surface having a connection part is directed to the opposite side to the base substrate 11. Although one semiconductor chip 33 is arranged in this embodiment, two or more semiconductor chips 33 may be arranged.

The insulating photosensitive resin layer 21 is formed on the base substrate 11 so as to completely enclose the semiconductor chip 33, and the top surface of the photosensitive resin layer 21 is planarized. The surface on which a plurality of external connection pads of the semiconductor chip 33 is formed corresponds to the top surface in the drawing. The thickness of the photosensitive resin layer 21 (the thickness on the base substrate 11) is the maximum value that can form the photo via. The maximum value is determined by a lithography process base on a material of the photosensitive resin layer. It has been demonstrated that a photo via can be formed with a silicone-based photosensitive resin (resin having a Young's modulus of 1 GPA or less at normal temperature, 0.1 GPA or less at 120° C., and that is exposed at an exposure dose of 800 mJ/cm$^2$ or more and 2600 mJ/cm$^2$ or less) without any problems in quality up to the thickness of about 180 μm to 200 μm. That is, a distance between a wiring 44b of the first layer of the photosensitive resin layer 21 forming the multilayer rewiring layer (in the drawing, the wiring of the first layer connected to a wiring photo via 44a connected to the connection part of the semiconductor chip 33) and the base substrate 11 can be realized up to about 180 μm to 200 μm. In order to securely enclose the semiconductor chip 33 and suppress the entire thickness of the photosensitive resin layer 21, the thickness of the first-layer wiring of the region overlapping with the chip surface is preferably 5 μm or more and 50 μm or less. Although the photosensitive resin layer 21 has a two-layer wiring structure in the drawing, it may have a multi-layer wiring structure of three or more layers. The photosensitive resin layer 21 becomes thicker when the number of layers is increased, but the distance between the layers are about 5 μm to 10 μm.

The rewiring layer 42 includes photosensitive resin layer 21 and a copper wiring layer 44 including the wiring photo vias 44a, 44c, and the wiring 44b. The photosensitive resin layer 21 is formed with a wall-shaped shield groove 44d (left and right ends in the drawing) so as to surround the semiconductor chip 33. The wiring photo via 44a is formed on the inner wall of the via hole 43a exposing the connection part (connection pad) on the surface on which the circuit of the semiconductor chip 33 is formed and the wiring photo via 44c for grounding is formed on the inner wall of the via hole 43c arranged at the outside of the semiconductor chip 33 and exposing the metal film 12. The wiring photo via 44a and the wiring photo via 44c are integrally formed of copper by the electroplating processing after vapor deposition of nickel or copper on the base, and an electric connection path formed of a metal film made of copper is formed in the vertical direction in the drawing. The inside of the via holes 43a and 43c is filled with the photosensitive resin layer 21.

The shield groove 44d is arranged on the outer periphery of a shield region so as to surround the semiconductor chip 33. The shield groove 44d is integrally formed on the inner wall of a groove 43d that exposes the metal film 12 with copper without a gap by the metal film made of copper together with the electroplating processing of the wiring photo vias 44a, 44c. As a result, the bottom part of the shield groove 44d is connected to the metal film 12 without a gap. The shield groove 44d and the metal film 12 form a structure in which the semiconductor chip 33 is covered with a metal film (a bottomed cylindrical structure), thereby realizing an electromagnetic wave shield function. The shield groove 44d is electrically connected to the wiring photo via 44c via the metal film 12. The wiring photo via 44c is for the ground potential (ground) line and connected to an external connection terminal and a solder ball 51a via the wiring 44b and the upper multilayer wiring. The solder ball 51a is connected to the ground line of the electronic device when mounted on the electronic device. The wiring photo via 44c is multiplexed so as to cope with disconnection damages in the unlikely event. The metal film 12 is connected to the ground potential via the wiring photo via 44c in the present embodiment, but it may be directly connected from the shield groove 44d. In particular, the shield groove 44d arranged in a rectangular shape may be connected to the external connection terminal for grounding via the wiring photo via for grounding of the upper layer at a predetermined interval on each side of the wiring of the first layer arranged so as to surround the rectangle in a band shape. In this way, the semiconductor device 10 can block electromagnetic noise from the outside and inside, thereby improving reliability.

The inner side surfaces of the wiring photo vias 44a, 44c, and the shield groove 44d are filled with the photosensitive resin layer 21, and a multilayered rewiring layer 42 is formed on the upper layer with a predetermined wiring photo via in which the inner side surface are also filled with the photosensitive resin layer 21 and a predetermined patterned wiring. The wiring photo vias 44a, 44c having different depths and the shield groove 44d are deeper than the wiring photo via for the simple multi-layered wiring of the upper layer. Also, the inside of the wiring photo vias 44a, 44c, and the shield groove 44d are filled with the photosensitive resin, and the entire surface is planarized by laminating a thin film-like photosensitive resin on the upper layer of the copper wiring layer 44 and heat-treated, or the like. Depending on the manufacturing process and the temperature environment during the operation of the product, there is a concern that the copper films of the wiring photo vias 44a and 44c having a via diameter of several tens of micrometers and the shield groove 44d may be damaged due to the influence of the temperature fluctuations. The concentration points of the thermal stresses acting on the wiring photo vias 44a, 44c, and the shield groove 44d due to the temperature fluctuations is the end of the via bottom/groove bottom and the upper end of the via/groove, but the photosensitive resin (silicone-based resin or bismaleimide-based resin) used in the present embodiment has a higher coefficient of thermal expansion CTE and a lower Young's modulus (soft) than other insulating resins (polyimide, epoxy resin, or the like), so that the restraining force acting on the copper film of the wiring photo vias 44a, 44c, and the shield groove 44d is small, and the shearing force is not generated to the extent that the copper film is damaged. The deeper the via length, the higher the thermal stress on the edge of the via bottom, but it has been demonstrated that no damage occurs up to about 180 μm to 200 μm. For example, in the case where the thermal expansion is low and the Young's modulus is high (hard) when a polyimide or epoxy resin is used, the restraining force of the wiring photo vias 44a, 44c, and the shield groove 44d acting on the copper film becomes large and the possibility of damaging the copper film is high, therefore, practical verification is required. It has also been confirmed that the thermal stresses caused by the copper wiring itself is larger than that of the photosensitive resins, and the effect of this thermal stresses is particularly large at the upper end of the via but the via lengths of about 180 μm to 200 μm are not damaged at the upper end of the via in the copper wiring in a semiconductor packaging field. The effect of the depth of the groove is the same. It may be filled with copper by electrolytic plating process so as to fill the inside of the wiring photo via 44a connected to the connection pad of the semiconductor chip 33 with the metal film. In this case, the wiring photo via 44c and the shield groove 44d deeper than the wiring photo via 44a are filled with the metal film thickly at the bottom thereof by the effect of the electroplating processing, and the photosensitive resin is filled thereon. Therefore, the metal film can be reliably formed in the long shield groove 44*d* of the total length, damage can be prevented.

In the present embodiment, since the inner surface of the shield groove 44*d* is composed of a double wall including an inner wall 44*d*1 arranged on the inside close to the semiconductor chip 33 across bottom surface and an outer wall 44*d*2 arranged on the outside far from the semiconductor chip 33, the semiconductor device 10 is improved shielding effect of the electromagnetic noise from the outside and inside, it is possible to improve the reliability. Furthermore, considering the influence of electromagnetic environment and the like, in the case of further improving the reliability by increasing the blocking effect of electromagnetic noise, the shield groove 44*d* may be arranged in double as necessary. In this case, the surface area is slightly larger.

An insulating layer 48 made of solder resist or other insulating film is formed on the opposite surface (top surface) of the base substrate 11 of the photosensitive resin layer 21. The rewiring layer 42 is exposed at the part where the insulating layer 48 does not exist. An external connection terminal 49 is formed on the copper wiring layer 46 of the rewiring layer 42 exposed from the insulating layer 48. A plurality of solder balls 51, 51*a* are arranged on the plurality of external connection terminals 49.

The wiring photo via 44*a* are in a position that does not overlap the outer peripheral edge of the semiconductor chip 33. A wiring photo via 45 are also in a position where it does not overlap the outer peripheral edge of the semiconductor chip 33. Furthermore, the external connection terminal 49 are preferably in a position where it does not overlap the outer peripheral edge of the semiconductor chip 33. The solder ball 51 are also preferably in a position where it does not overlap the outer peripheral edge of the semiconductor chip 33. That is, although the photosensitive resin having the semiconductor chip 33 is completely cured by exposing, developing, and then heat-treating a silicone-based or bis-maleimide-based resin or a soft polymer material, the hardness is lower than that of a polyimide resin which is a typical rewiring material, and a small step tends to occur at a part located at the outer peripheral edge. It is possible to further improve the reliability of the semiconductor device 10 by arranging the external connecting terminal 49, the solder ball 51, and the wiring photo via 45 so as not to overlap the outer peripheral edge of the semiconductor chip 33.

The plurality of via holes 43*a*, 43*c*, and the groove 43*d* formed in the photosensitive resin layer 21 are formed by dissolving and removing the resin by selectively irradiating the photosensitive resin with light and performing the developing process. The via hole of the wiring photo via 45 connecting the copper wiring layers 44 and 46 are also formed by stacking the film-like photosensitive resins and then undergoing the same developing process. The depths of the openings of the via holes 43*a*, 43*c*, and the groove 43*d* are different from each other because the surface on which the connection pad of the semiconductor chip 33 is formed and the metal film 12 of the base substrate have different heights from the top surface of the photosensitive resin layer 21. The aspect ratio of the via holes 43*a*, 43*c*, and the groove 43*d* are also different. The aspect ratio of the via hole 43*a* is smaller than the aspect ratio of the via hole 43*c* and the groove 43*d*. Further, the aspect ratio of the via hole 43*a* is 1.5 or less. The smaller the aspect ratio of the via hole, the defect rate of the wiring photo via formed in the via hole is suppressed. Therefore, the connection reliability of the wiring photo via 44*a* arranged in the via hole 43*a* is improved by the aspect ratio of the via hole 43*a* is 1.5 or less. If the width of the groove 43*d* is set to 150 μm and the depth is set to 180 μm to 200 μm, the aspect ratio becomes 1.5 or less, thereby improving the connection reliability. On the other hand, if the aspect ratio of the groove 43*d* is 2.5 or more, the connection failure rate increases, which is not preferable in practical use. Here, the aspect ratio of the via holes 43*a*, 43*c* is defined as the value obtained by dividing the height of the opening by the maximum diameter of the bottom end of the opening. The aspect ratio of the groove 43*d* is defined as the value obtained by dividing the height of the opening by the maximum width of the bottom width of the opening. Since the wiring photo vias 44*a*, 44*c*, and the shield groove 44*d* have an ultra-thin copper film (about 2 μm to about 10 μm) inscribed of the via holes 43*a*, 43*c*, and the groove 43*d*, the thickness of the copper film does not affect the aspect ratios of the wiring photo vias 44*a*, 44*c*, and the shield groove 44*d*.

Although a corner part of the outer peripheral shape (rectangular) of the shield groove 44*d* is 90 degrees in the present embodiment, it is possible to reduce or eliminate the desmear treatment of the formation process of the metal film on the inside of the shield groove 44*d* by smoothly curved the corner part. The radius of curvature of this curve is desirably equal to or larger than the width of the groove, and if the width is 100 μm, the radius of curvature is desirably equal to or larger than 100 μm.

With such configuration, it is possible to inexpensively realize a highly reliable electromagnetic wave shield function by using a FOWLP structure suitable for system integration of the semiconductor chip. Since the metal film 12 and the shield groove 44*d* are protected by the substrate or the photosensitive resin layer 21 without being exposed to the outside, mechanical damages can also be prevented. In addition, in a case of a non-metal substrate that serves as a support material for the base substrate 11, it is easy to mark (indicate) the product model number, product name, and the like with ink or laser.

Figure 2:
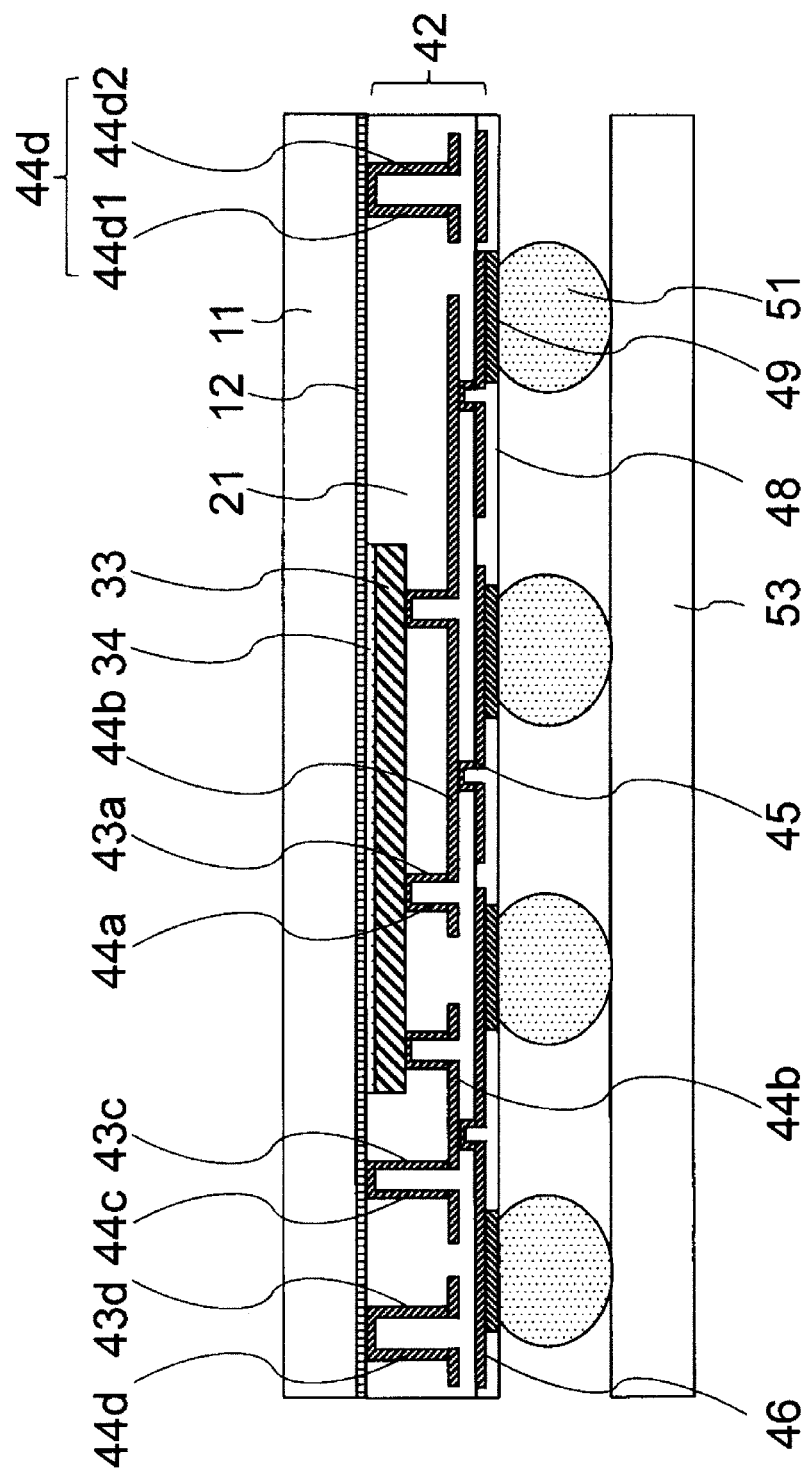
FIG. 2 is a cross-sectional view of a semiconductor device (after mounting) according to an embodiment of the present invention.

FIG. 2 is a cross-sectional view after mounting of the semiconductor device according to an embodiment of the present invention. The semiconductor device 10 shown in FIG. 1 is connected to a print substrate 53 by the solder ball 51. For mounting on the print substrate 53, first, the individualized semiconductor device 10 is vertically inverted, mounted on the print substrate 53. The individualized semiconductor device 10 is mounted so that the solder ball 51 lands on the connecting terminal of the print substrate 53. Subsequently, blowing hot air (reflow process), melting the solder ball 51, and the individualized semiconductor device 10 is electrically connected to the connecting terminal of the print substrate 53.

In this state, covering the solder ball 51 with an underfill (not shown). The underfill is a highly flowable epoxy resin, and when the epoxy resin is dropped in the vicinity of the individualized semiconductor device, the epoxy resin flows between the print substrate 53 and the rewiring layer 42 due to the capillary phenomenon. In this manner, the solder ball 51 is covered with the underfill.

As described above, the semiconductor device according to an embodiment of the present invention can be realized at a low cost while ensuring the reliability of the electromagnetic wave shield function by using a FOWLP structure suitable for system integration in a FOWLP structure.

The manufacturing process of the semiconductor device according to the present embodiment is shown in FIGS. 3A to 9B. FIGS. 3A, 4A, 5A, 6A, 7A, 8A, and 9A are top views showing the manufacturing process of the semiconductor device according to an embodiment of the present invention.

Figure 3A:
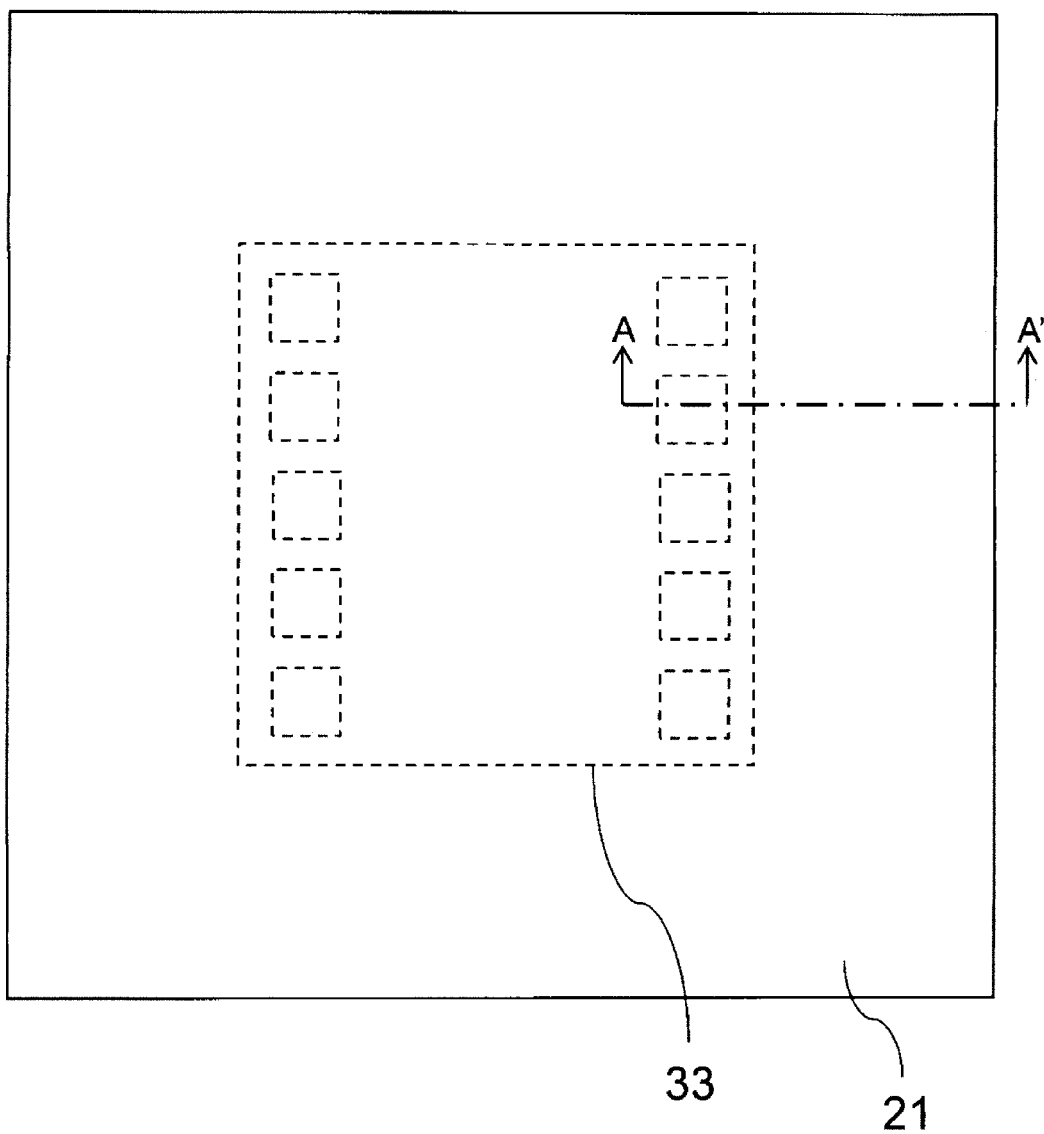
FIG. 3A is a top view showing a method for manufacturing a semiconductor device according to an embodiment of the present invention.
Figure 3B:
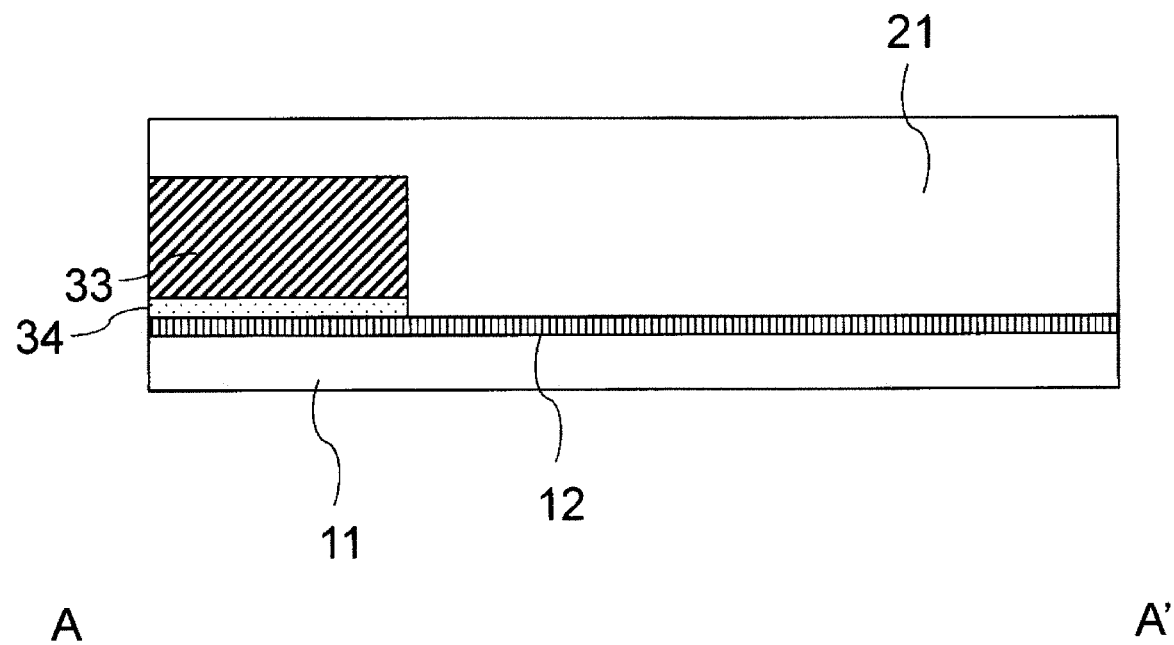
FIG. 3B is an enlarged cross-sectional view showing a method for manufacturing a semiconductor device according to an embodiment of the present invention.

FIGS. 3B, 4B, 5B, 6B, 7B, 8B, and 9B are A-A' cross-sectional views showing the manufacturing process of the semiconductor device according to an embodiment of the present invention. As shown in FIGS. 3A and 3B, the metal film 12 is formed on substantially the entire surface of the base substrate 11. The metal film 12 is formed by, for example, a copper plating method. First, the titanium (Ti)/copper (Cu) stacked thin film serving as a seed of a copper plating is formed on the entire surface of the base substrate 11 by sputtering. Subsequently, the metal film 12 is formed on substantially the entire surface of the base substrate 11 by applying a copper (Cu) plating using the titanium (Ti)/copper (Cu) stacked thin film as the seed. The base substrate 11 may be formed by bonding or applying a separately prepared metal film 12 and may be a copper plate itself having sufficient rigidity.

The semiconductor chip 33 is fixed on the metal film 12 via the adhesive layer 34. The thickness of the semiconductor chip 33 is usually 100 μm or less, and generally about 70 μm. The surface on which the integrated circuit of the semiconductor chip 33 is formed (the surface on which the connection pad is formed) corresponds to the top surface in the drawing. The photosensitive resin layer 21 made of a photosensitive resin is formed on the semiconductor chip 33. The thickness of the photosensitive resin layer 21 is 200 μm or less, and after lamination, it is 10 μm to 50 μm thicker than the thickness of the semiconductor chip 33. If the thickness of the semiconductor chip 33 is 70 μm, the photosensitive resin layer 21 has a thickness of about 100 μm. The material of the photosensitive resin is not particularly limited but is formed by vacuum laminating a dry film. First, the film-like photosensitive resin is laminated on the semiconductor chip 33 (the film-like photosensitive resin is temporarily bonded on the semiconductor chip 33 at 100° C. and then evacuated), and a part raised on the semiconductor chip 33 is planarized by a simple press (planarized at 60° C. for about 5 minutes) and provisionally cured (at 100° C. for about 5 minutes). The insulating photosensitive resin is composed of a silicone-based or bismaleimide-based resin or a soft polymer material. Since the photosensitive resin embeds so as to cover the semiconductor chip 33, the elastic modulus (Young's Modulus) is desirably 1 GPA or less at room temperature and 0.1 GPA or less at 125° C. In a case where the photosensitive resin layer 21 is a silicone-based resin, the elastic modulus can be set within the above range by appropriately adjusting the crosslinking density and the length of the molecular chain. Since a typical epoxy sealing agent is several tens of GPA at room temperature, a material having a considerably low elastic modulus is used. As the photosensitive resin layer 21, a known photosensitive resin material can also be used as long as the above condition is satisfied. When the elastic modulus becomes 1 GPA or more at room temperature or 0.1 GPA or more at 125° C., the embedding of the semiconductor chip 33 becomes difficult, and failure such as voids, delamination, and chip damage when embedding is likely to occur.

The photosensitive resin layer 21 is formed by vacuum-lamination using a dry film, whereby the top surface (the surface opposite to the base substrate 11) can be formed substantially flat. However, the top surface of the photosensitive resin layer 21 (the surface opposite to the base substrate 11) may be slightly raised at the position where the semiconductor chip 33 is arranged, and the top surface of the photosensitive resin layer 21 may be slightly stepped along the outer peripheral edge of the semiconductor chip 33. In the planarization process, even if this small step occurs, it is controlled to be several microns or less (wiring width or less). A method of manufacturing by lamination is described here, but sealing by molding by a mold, slit coating, or the like is also conceivable.

The photosensitive resin layer 21 has a small step in a region overlapping with the outer peripheral edge of the semiconductor chip 33. The rewiring formed upward so as to straddle this step is affected by the height of this step, and the possibility of wire breakage increases if the wiring width is reduced. In order to suppress the possibility of wire breakage, it is better that the wiring width is wide, and the step is controlled low for reliability.

Figure 4A:
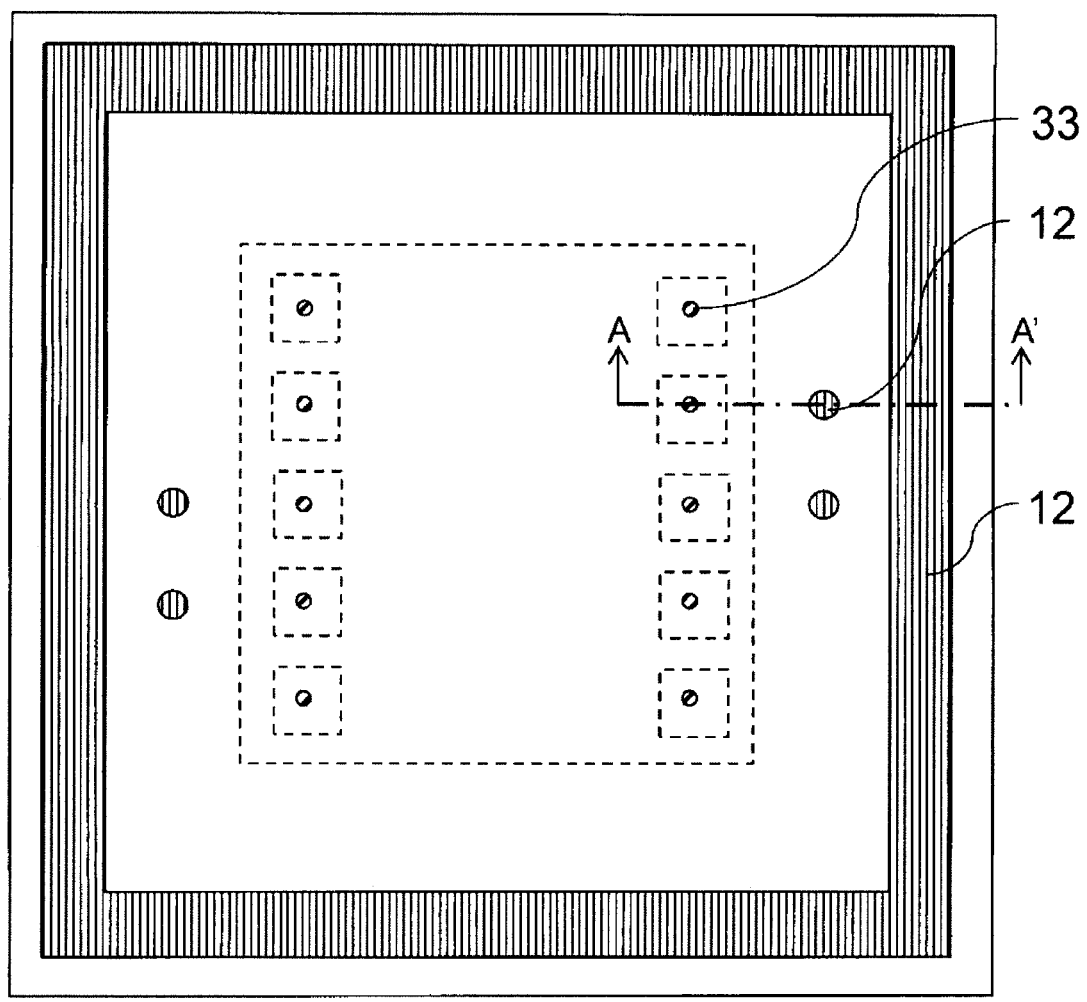
FIG. 4A is a top view showing a method for manufacturing a semiconductor device according to an embodiment of the present invention.
Figure 4B:
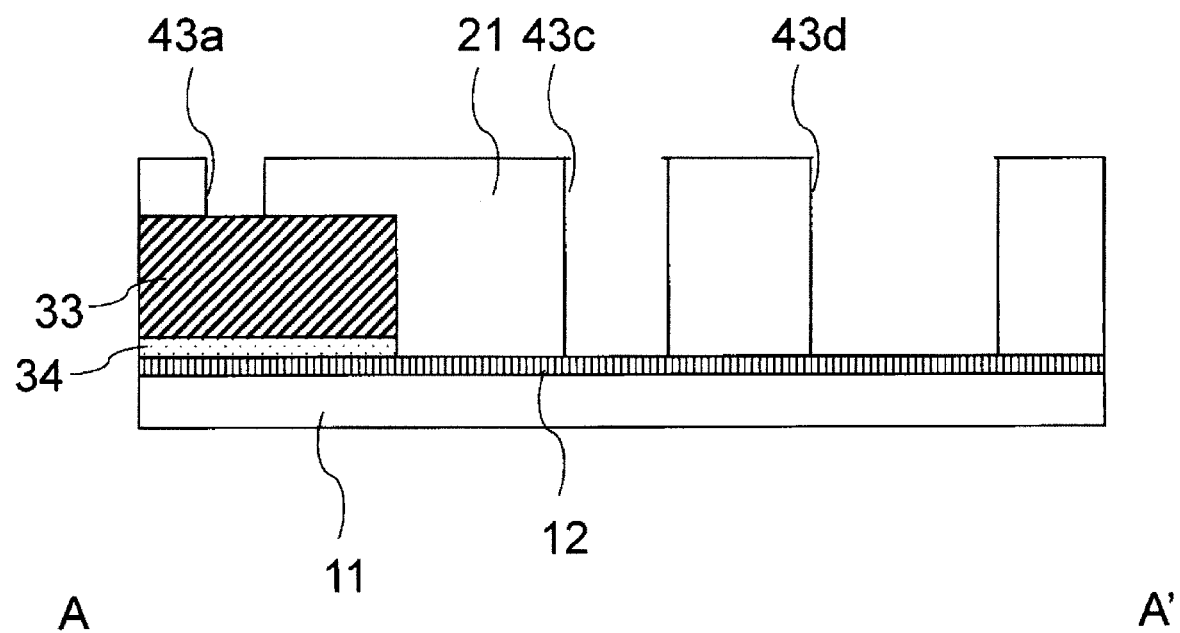
FIG. 4B is an enlarged cross-sectional view showing a method for manufacturing a semiconductor device according to an embodiment of the present invention.

Next, as shown in FIGS. 4A and 4B, the via hole 43a exposing the connection part (connection pad) which is a part of the semiconductor chip 33, the via hole 43c exposing the connection part of the metal film 12, and the groove 43d exposing the connection part of the metal film 12 are formed in the planarized photosensitive resin layer 21. The method of forming the via hole 43a, 43c, and the groove 43d is the same.

The planarized photosensitive resin layer 21 is temporarily heated to such an extent that it does not completely cure (temporary curing), and then is selectively irradiated with ultraviolet rays and exposed from the side of the photosensitive resin layer 21 opposite to the base substrate 11. Ultraviolet rays are generated by a metal halide lamp or a high-pressure mercury lamp and selectively irradiate through the opening of a stencil mask arranged on the photosensitive resin layer 21. The photosensitive resin layer 21 located below the opening of the stencil mask is exposed to the ultraviolet rays. The distance between the top surface of the photosensitive resin layer 21 and the stencil mask 56 may be, for example, 0 μm or more and less than 10 μm in the case of an aligner, and the distance may be 10 cm or more and less than 20 cm in the case of a stepper.

In the present embodiment, the photosensitive resin is exposed at an exposure amount of 800 mJ/cm$^2$ or more and 2000 mJ/cm$^2$ or less. More preferably, the photosensitive resin is exposed at an exposure amount of 800 mJ/cm$^2$ or more and 1600 mJ/cm$^2$ or less. The via holes 43a, 43c having different depths, and the groove 43d can be collectively formed by performing collective exposure with one mask at an exposure amount within the above range. In other words, in this embodiment, the photosensitive resin is exposed to an extent that the via hole 43c and the groove 43d can be formed, that is, an excessive amount of exposure to form the via hole 43a. It is desirable that the photosensitive resin has a light transmittance of 85% or more at a wavelength of 350 nm or more. The light transmittance of the photosensitive resin was calculated by forming a 15 μm-thick resin on a glass substrate, curing it, and calculating the transmittance from the light absorption/transmittance at the respective wavelengths. In a case where the photosensitive resin is a silicone-based resin, the light transmittance can be set within the above range by appropriately adjusting the crosslinking density, the length of the molecular chain, and the like. By setting the exposure amount and the light transmittance of the photosensitive resin of the photosensitive resin layer 21 within the above range, the via holes 43a, 43c, and the groove 43d can be collectively formed. After exposure, heat processing is performed, and the photosensitive resin which has not been selectively irradiated is dissolved and removed (developed) by the developing process. After rinsing, the via holes 43a, 43c, and the groove 43d of the photosensitive resin layer 21 can be collectively formed by the main curing by the heat treatment.

The metal film 12 of the base substrate and the surface on which the connection pad of the semiconductor chip 33 is formed are different from each other in height from the top surface of the photosensitive resin layer 21. Therefore, the aspect ratios of the via hole 43a and the aspect ratios of the via hole 43c are also different. The aspect ratio of the via hole 43a is smaller than the aspect ratio of the via hole 43c. Further, the aspect ratio is preferably 1.5 or less. In a case where the semiconductor chip 33 has a thickness of about 70 µm, the photosensitive resin layer 21 has a thickness of about 100 µm, the diameter of the via hole 43a is 30 µm, and the diameter of the via hole 43c is 70 µm, the aspect ratio of the via hole 43a is 1.0 and the aspect ratio of the via hole 43c is 1.42.

Figure 5A:
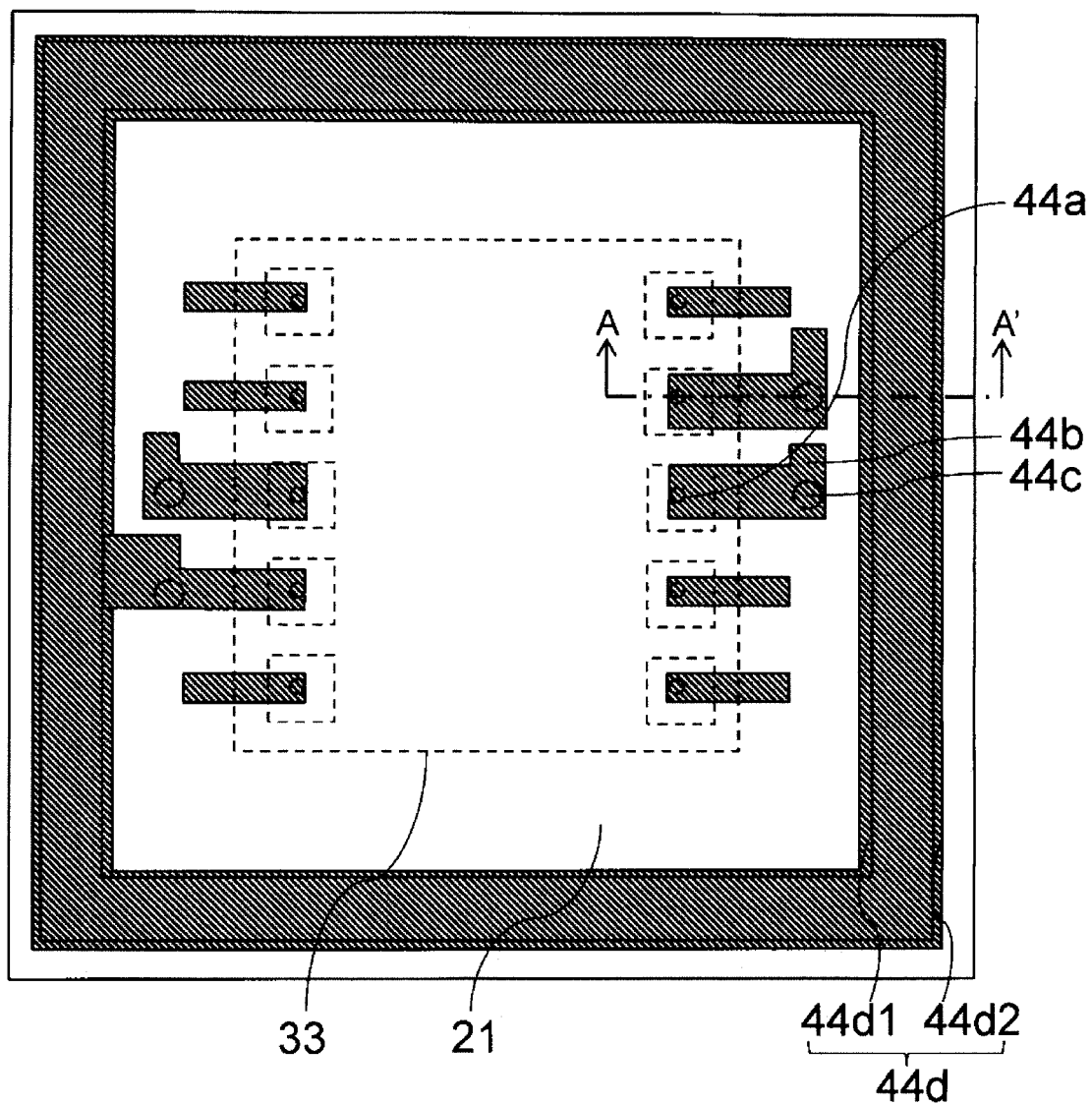
FIG. 5A is a top view showing a method for manufacturing a semiconductor device according to an embodiment of the present invention.
Figure 5B:
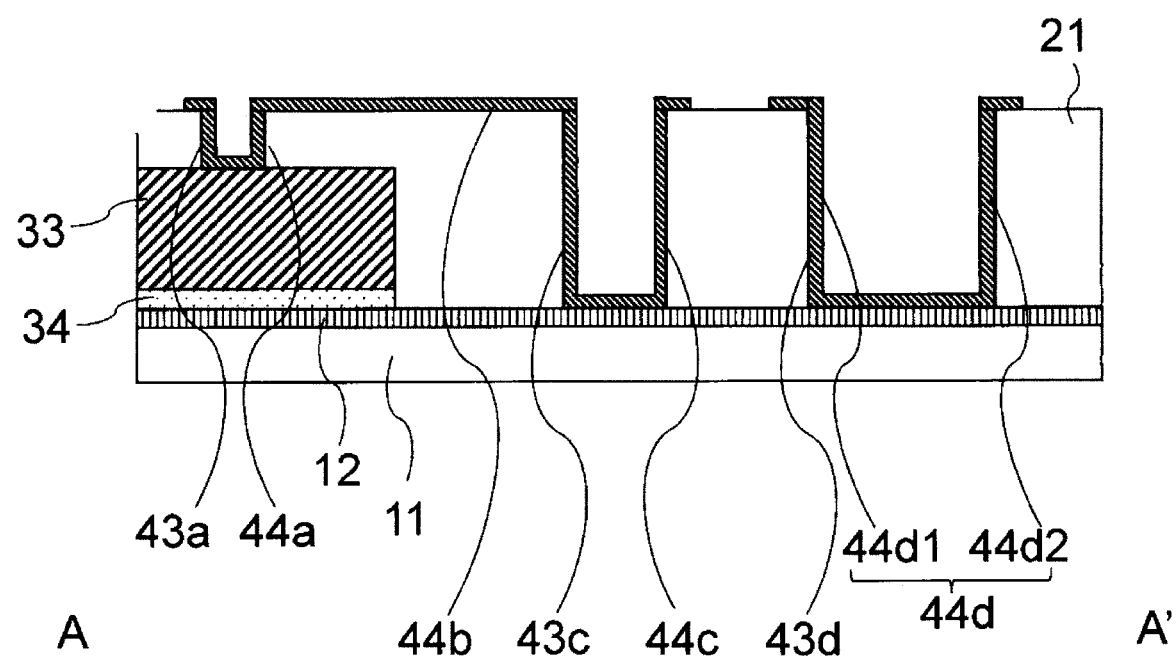
FIG. 5B is an enlarged cross-sectional view showing a method for manufacturing a semiconductor device according to an embodiment of the present invention.

As shown in FIGS. 5A and 5B, the copper wiring layer 44 is formed by a copper plating method. The copper wiring layer 44 in this embodiment is formed by an electroplating processing because the via hole 43c and the groove 43d are deep. First, the titanium (Ti)/copper (Cu) stacked thin film serving as a seed of a copper plating is formed on the entire surface by sputtering. Photosensitive resists are applied on the surface and patterned to expose the wiring region. Subsequently, after applying a cupper (Cu) plating using the part of the titanium (Ti)/copper (Cu) stacked thin film exposed from the photosensitive resist as the seed, the copper wiring layer 44 is formed by peeling off the photosensitive resist and etching off the seed layer other than the copper wiring pattern. The inner surfaces of the via hole 43a, 43c, and the groove 43d are also copper plated by this process, and the wiring photo vias 44c, 44a, and the shield groove 44d are formed. That is, the wiring 44b arranged on the top surface of the photosensitive resin layer 21, the wiring photo vias 44c, 44a, and the shield groove 44d are integrally formed.

The wiring photo vias 44a, the wiring 44b, the wiring photo via 44c, and the shield groove 44d which are integrally formed by the electroplating process are characterized in that the underlying metal is formed by sputtering and have a dense layer as compared with the electroless plating or the like. The electroless plating has a porous structure, and the adhesion to the photosensitive resin layer 21 is poor, which is highly likely to cause reliability problems. The wiring photo via 44a, the wiring 44b, the wiring photo via 44c, and the shield groove 44d, which are formed on the underlayer by the electroplating processing, can form a stacked structure having a substantially uniform and stable thickness and high adhesion on the photosensitive resin layer 21, which reflects the structure of the top surface of the photosensitive resin layer 21.

Figure 6A:
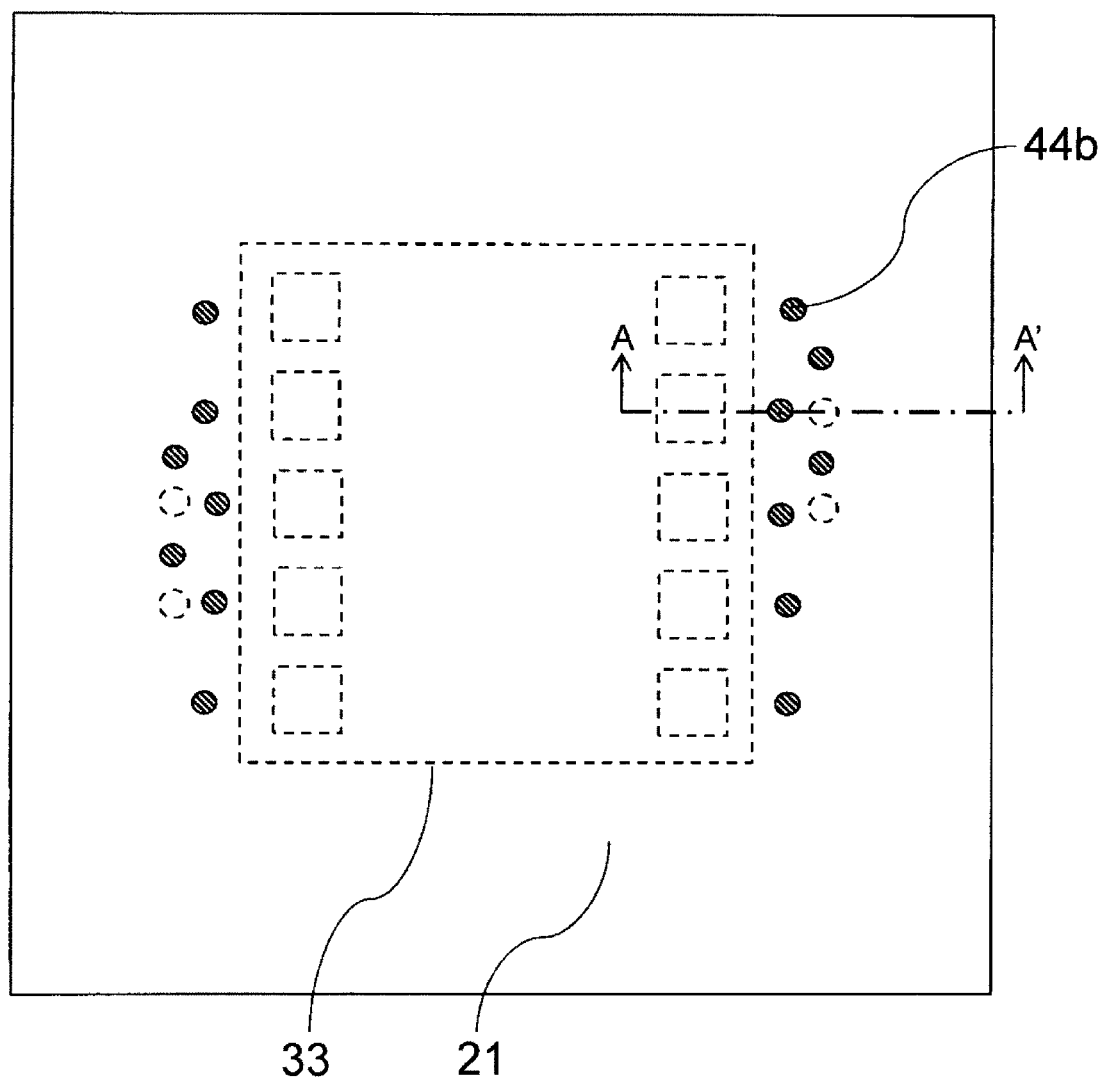
FIG. 6A is a top view showing a method for manufacturing a semiconductor device according to an embodiment of the present invention.
Figure 6B:
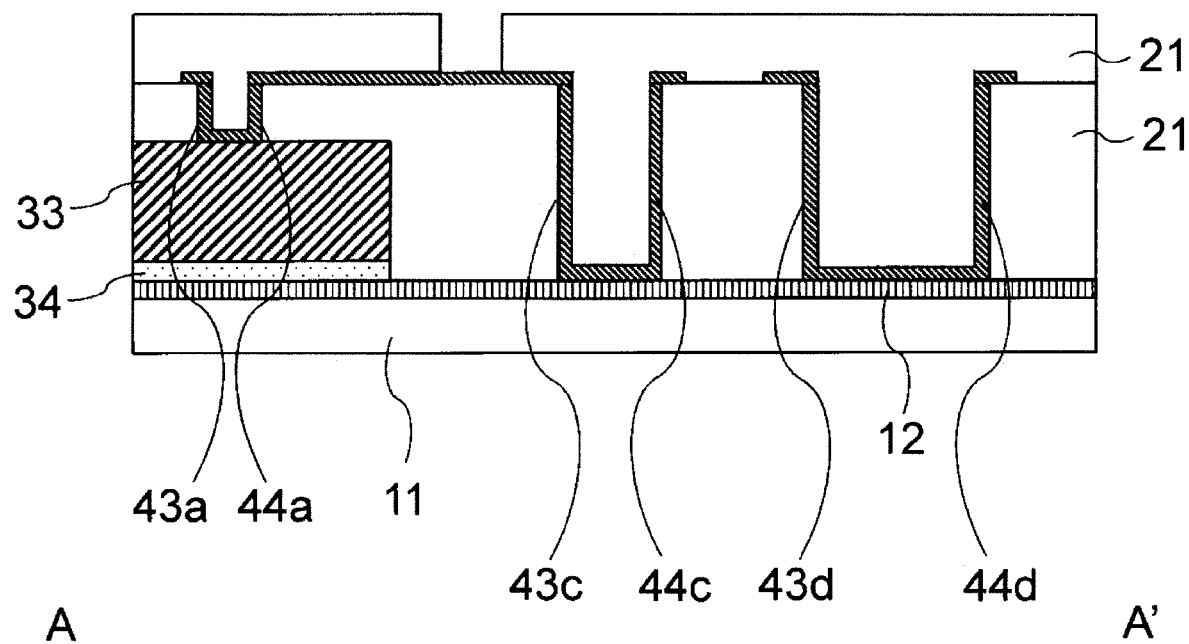
FIG. 6B is an enlarged cross-sectional view showing a method for manufacturing a semiconductor device according to an embodiment of the present invention.

As shown in FIGS. 6A and 6B, the photosensitive resin layer 21 made of a photosensitive resin is formed on the copper wiring layer 44. Specifically, the photosensitive resin layer 21 is formed by vacuum lamination using a film-like photosensitive resin material (dry film) having a film thickness of about 15 µm. As a result, the inside of the wiring photo vias 44a, 44c, and the shield groove 44d are filled with the photosensitive resin, and the exposed top surface becomes flat. The same material base as the photosensitive resin for embedding the semiconductor chip 33 is used as the photosensitive resin arranged on the copper wiring layer 44. By using the same photosensitive resin, each layer is multilayered by bonding without a boundary layer, and the photosensitive resin layer 21 is integrated. Since each layer is thin even with the different kinds of liquid photosensitive resin system, bonding is weakened somewhat, but interlayer bonding which can ensure a predetermined quality is possible. Since the final thickness is a film thickness of about 5 µm, it is also possible to spin coat or slit coat the liquid photosensitive resin material of a kind different from that of the photosensitive resin material according to the present embodiment. The via hole for the wiring photo via 45 is formed in the photosensitive resin layer 21 on the copper wiring layer 44 through the processing of temporary curing, exposure, development, and the main curing.

Figure 7A:
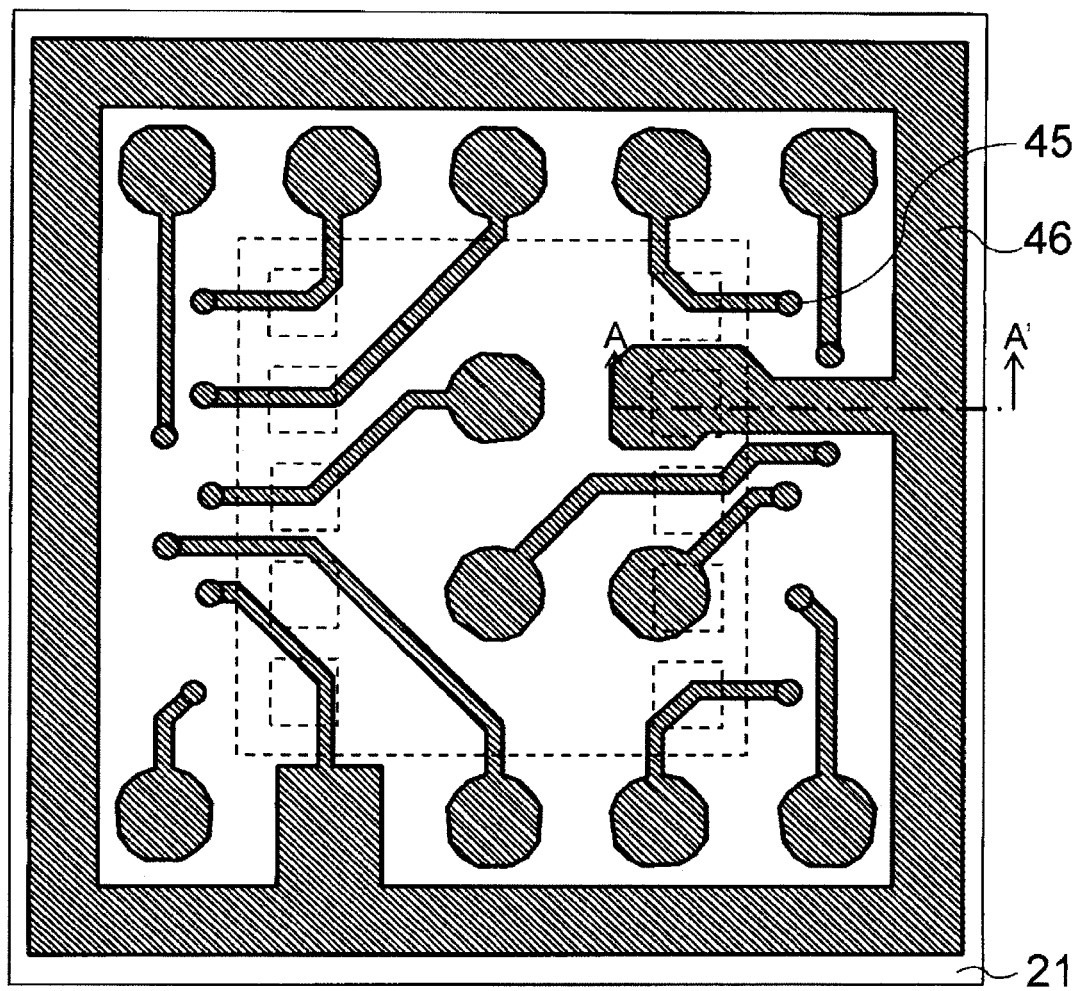
FIG. 7A is a top view showing a method for manufacturing a semiconductor device according to an embodiment of the present invention.
Figure 7B:
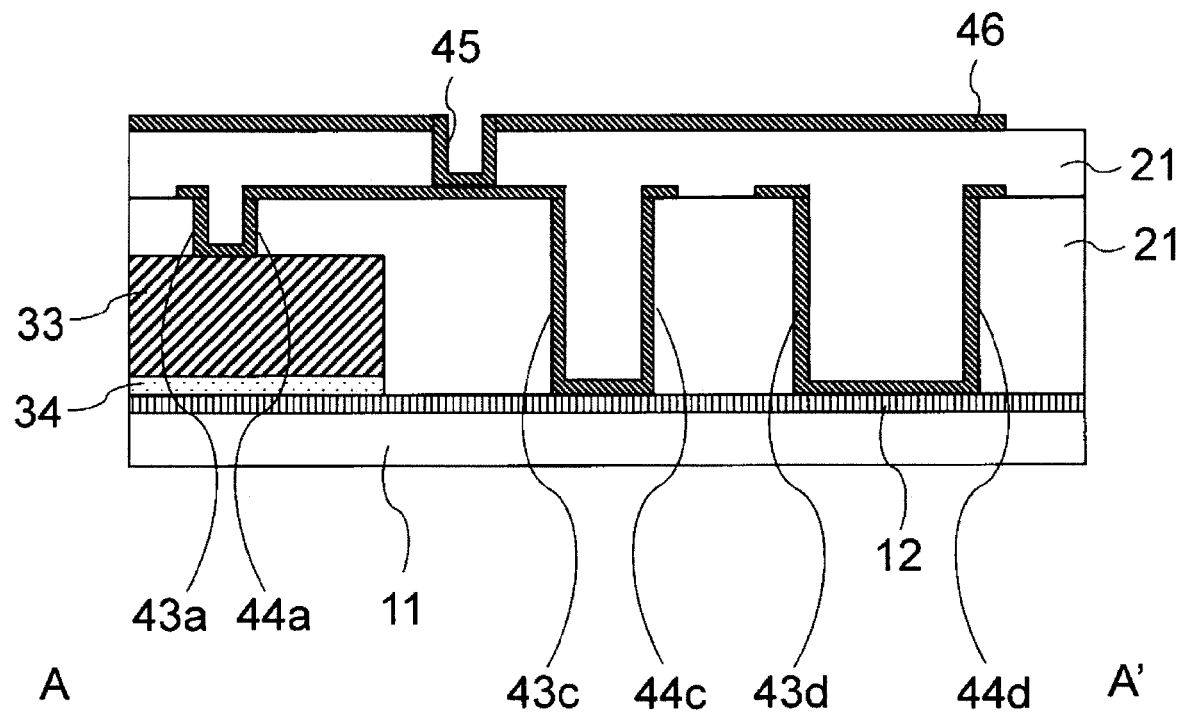
FIG. 7B is an enlarged cross-sectional view showing a method for manufacturing a semiconductor device according to an embodiment of the present invention.

As shown in FIGS. 7A and 7B, the copper wiring layer 46 including the wiring photo via 45 is formed by a subsequent copper metallization processing. The copper wiring layer 46 is also formed by repeating the same processes as the copper wiring layer 44.

Figure 8A:
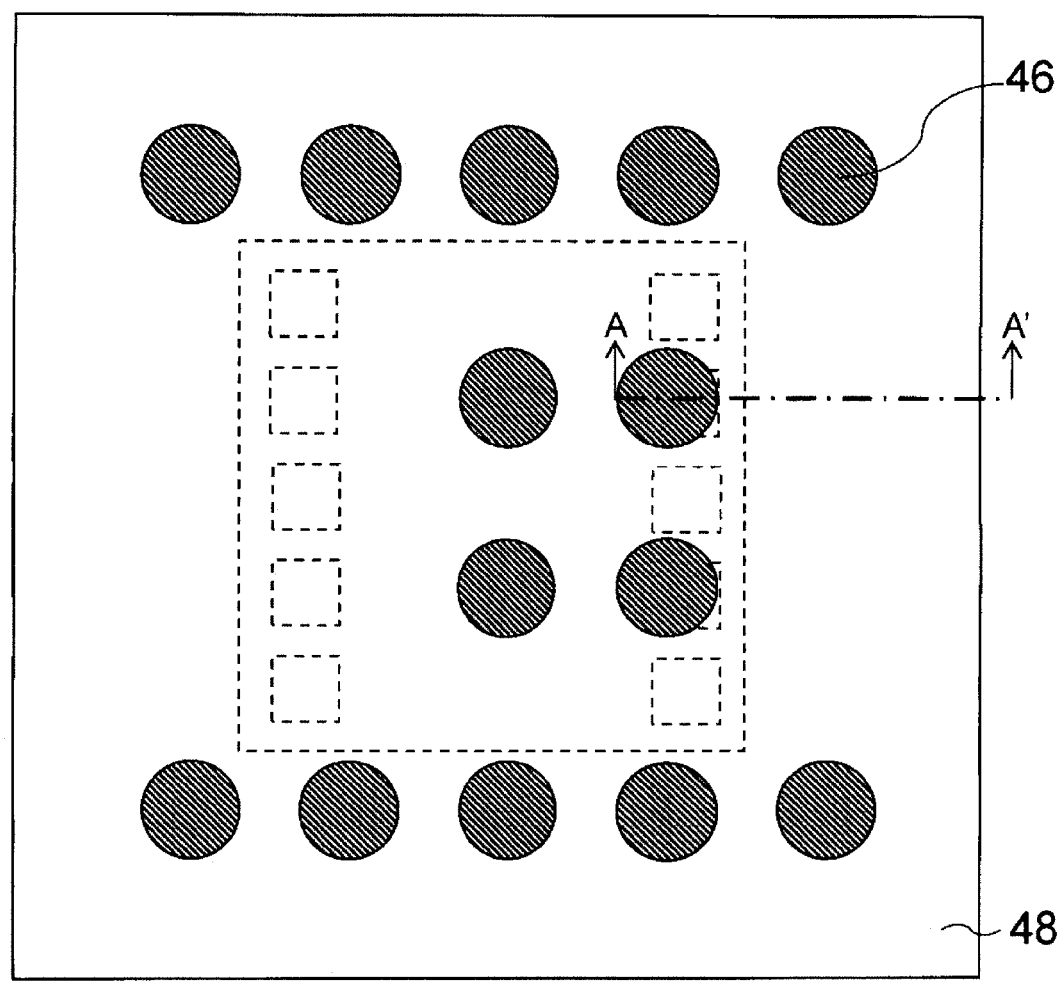
FIG. 8A is a top view showing a method for manufacturing a semiconductor device according to an embodiment of the present invention.
Figure 8B:
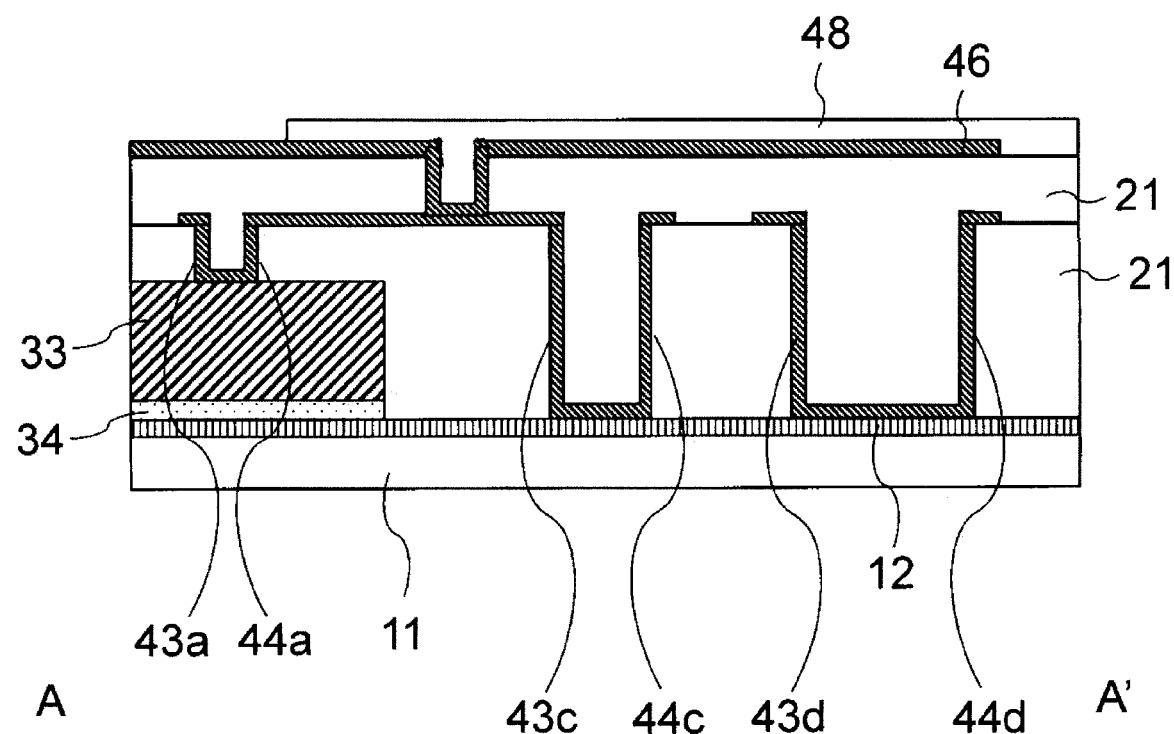
FIG. 8B is an enlarged cross-sectional view showing a method for manufacturing a semiconductor device according to an embodiment of the present invention.

As shown in FIGS. 8A and 8B, the insulating layer 48 made of solder resist or other insulating film is further formed on the copper wiring layer 46. Specifically, the insulating layer 48 may be formed by vacuum lamination using a film-like photosensitive resin material (dry film) having a film thickness of about 5 µm to 10 µm. As a result, the inside of the wiring photo via 45 is filled with photosensitive resin, and the exposed top surface becomes flat. The photosensitive resin arranged on the copper wiring layer 46 is preferably the same material base as the photosensitive resin that embeds the semiconductor chip 33. Since the final thickness is a film thickness of about 5 µm to 10 µm, it is also possible to spin coat or slit coat a liquid photosensitive resin material of a kind different from that of the photosensitive resin material according to the present embodiment.

Figure 9A:
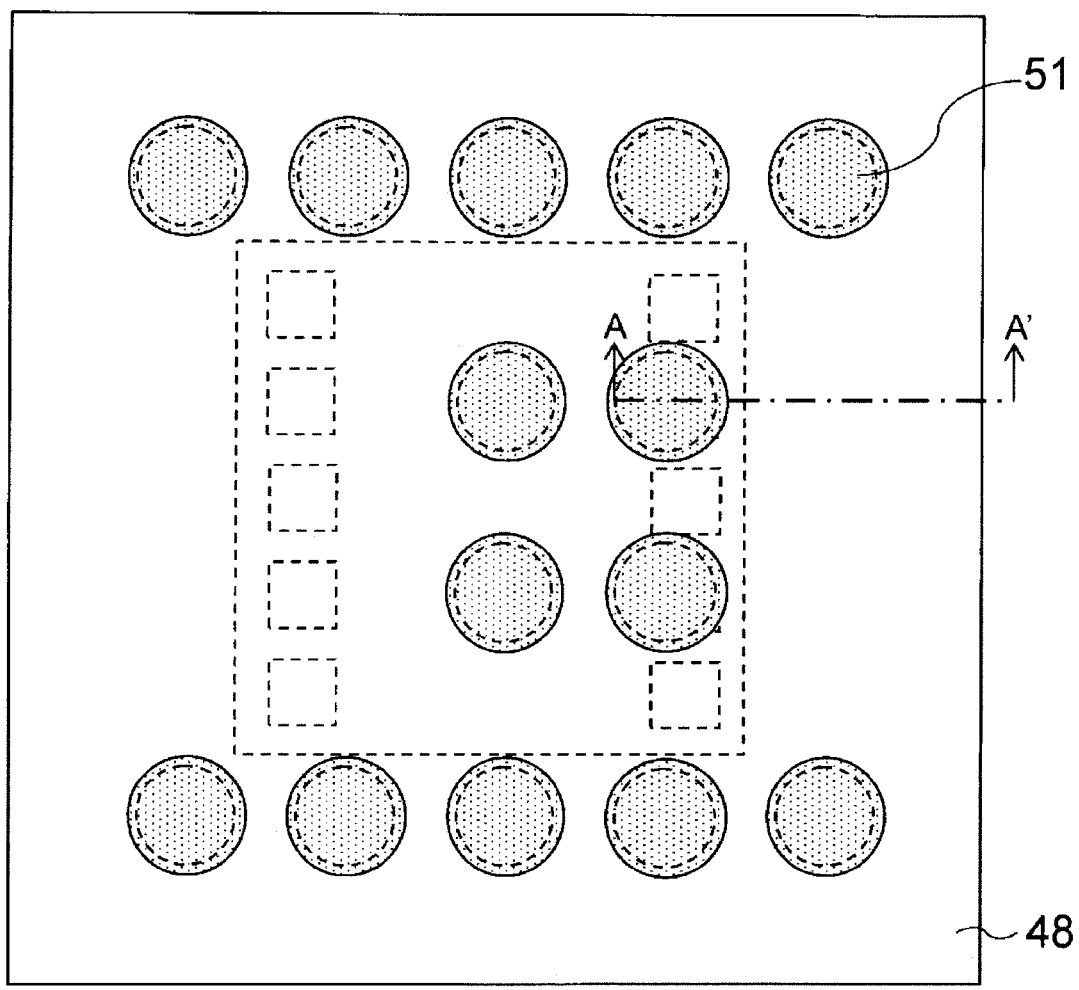
FIG. 9A is a top view showing a method for manufacturing a semiconductor device according to an embodiment of the present invention.
Figure 9B:
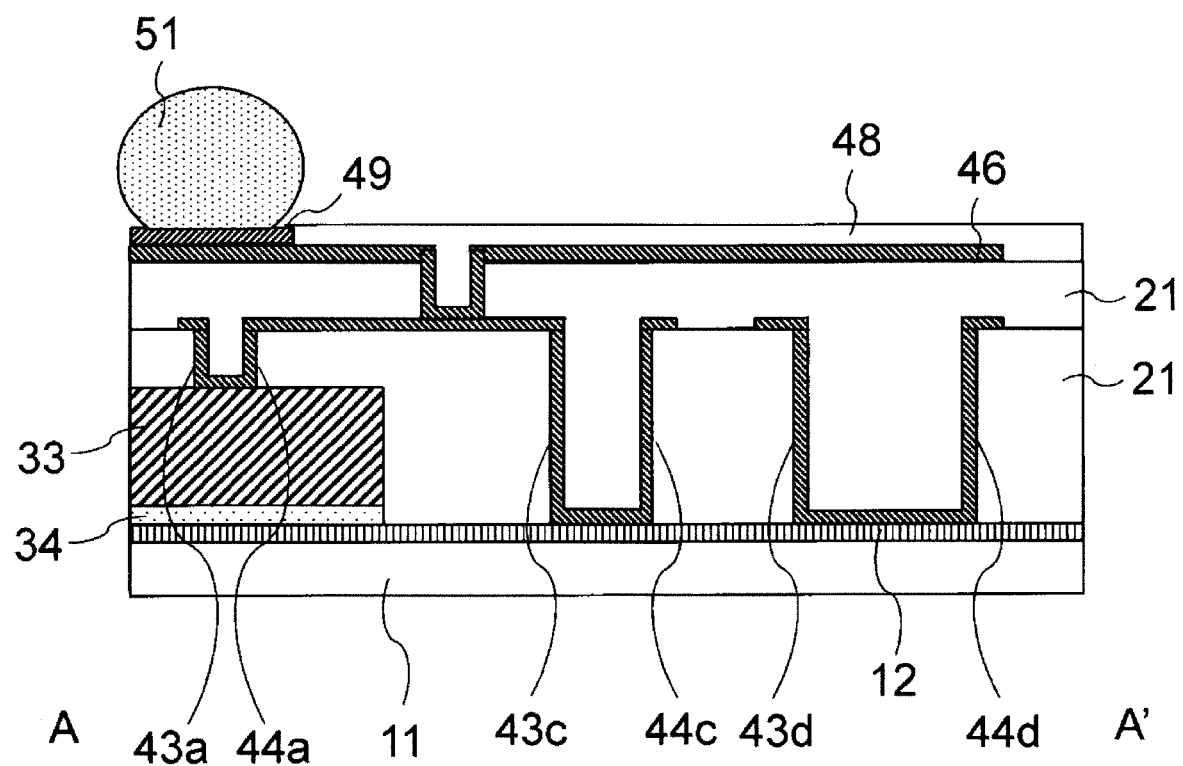
FIG. 9B is an enlarged cross-sectional view showing a method for manufacturing a semiconductor device according to an embodiment of the present invention.

As shown in FIGS. 9A and B, the external connection terminal 49 is formed on the copper wiring layer 46 of the rewiring layer 42 exposed from the insulating layer 48, and a plurality of solder balls 51 is formed on the plurality of external connection terminals 49.

In this manner, in the method for manufacturing a semiconductor device according to the present embodiment, wiring photo vias and the shield groove 44d having different heights connecting the semiconductor chip 33 and the metal film 12 in the base substrate can be connected to the rewiring layer 42 at a low cost.

FIG. 10 is a cross-sectional view of a semiconductor device 10A according to an embodiment of the present invention. The semiconductor device 10A is a semi-finished product of temporary wafers and panels. The left and right ends of the diagram are connected to the semiconductor device 10A of the same configuration and are individualized in a later process. The semiconductor device 10A according to the present embodiment differs from the semiconductor device according to the above-described embodiment in that the semiconductor device 10A according to the present embodiment includes a plurality of semiconductor chips 33. In the drawings referred to in the following embodiments, portions that are the same as or have the same functions as those of the above-described embodiments are denoted by the same numerals or the same numerals followed by the addition of an alphabet, and a repetitive description thereof will be omitted.

The semiconductor device 10A includes the base substrate 11 including the metal film 12, a semiconductor chip 33a arranged on the metal film 12, a semiconductor chip 33b, and the rewiring layer 42. In this embodiment, the metal film 12 is formed on substantially the entire surface of the base substrate 11.

The semiconductor chips 33a and 33b having different chip thicknesses are fixed to the metal film 12 of the base substrate via an adhesive material 34a or 34b. The semiconductor chips 33a and 33b are mounted with an interval in a Face-up manner so that the surface on which the connection part is formed faces the opposite side to the base substrate. In the present embodiment, two semiconductor chip 33 were juxtaposed. However, the present invention is not limited thereto, the semiconductor chip 33 may be arranged one, or it may be juxtaposed three or more. The thickness of the semiconductor chip 33a is thicker than the thickness of the semiconductor chip 33b. The semiconductor chips 33a and 33b are embedded with the photosensitive resin layer 21 and planarized with respect to the base substrate by a simple press of the photosensitive resin layer 21. The surface on which the connection pads of the semiconductor chip 33a, 33b are formed corresponds to the top surface in the drawing. Thus, the surface on which the connection pads of the semiconductor chips 33a and 33b are formed is embedded in the photosensitive resin layer 21, and distances from the top surface of the photosensitive resin layer 21 are different. The maximum thickness of the photosensitive resin layer 21 is the thickness at which a photo via can be formed but is determined by the relation with the lithography process. It has been demonstrated that a photo via can be formed with a silicone-based photosensitive resin without any problems in quality up to the thickness of 180 μm to 200 μm. The photosensitive resin layer 21 preferably have the film thickness of 5 μm or more and 50 μm or less at the region overlaps with the surface having the connection pad of the semiconductor chip 33a, in order to reliably enclose the thickest semiconductor chip 33a and suppress the thickness.

The rewiring layer 42 includes the photosensitive resin layer 21 and the copper wiring layer 44. The photosensitive resin layer 21 includes a plurality of via holes 43aa and 43ab for exposing the connection part (connection pad) which is a part of the semiconductor chips 33a and 33b, the via hole 43c arranged around the semiconductor chip 33 for exposing the metal film 12, and the groove 43d for surrounding the semiconductor chip 33 and exposing the metal film 12. The copper wiring layer 44 includes wiring photo vias 44aa, 44ab arranged on the inner side surfaces and the bottom surface of the via holes 43aa, 43ab, the wiring 44b arranged substantially parallel to the surface on which the connection pad of the semiconductor chips 33a and the semiconductor chip 33b is formed, the wiring photo via 44c arranged on the inner side surface and the bottom surface of the via hole 43c, and the shield groove 44d arranged on the inner side surface and the bottom surface of the groove 43d. The wiring 44b is arranged substantially parallelly between the surface (bottom surface) of the base substrate side of the photosensitive resin layer 21 and the surface (top surface) of the opposite side of the base substrate of the photosensitive resin layer 21. In this embodiment, the wiring photo vias 44aa, 44ab located on the inner side surface and the bottom surface of the via holes 43aa, 43b, the wiring 44b, the wiring photo via 44c located on the inner side surface and the bottom surface of the via hole 43c, and the shield groove 44d located on the inner side surface and the bottom surface of the groove 43d are formed integrally, and electronically connected in the depth direction of the drawing (not shown). With such configuration, the semiconductor chip 33a, is electrically connected to the semiconductor chip 33b via the copper wiring layer 44 in the rewiring layer 42.

The shield groove 44d is arranged so as to surround two outer surfaces of the semiconductor chip 33a, 33b. Further, the shield groove 44d is arranged so as to surround the wiring photo vias 44aa, 44ab, 44c, and the wiring 44b. That is, the shield groove 44d is arranged near the outer periphery of the rewiring layer 42 to surround the side surfaces of the semiconductor chips 33a, 33b, the wiring photo vias 44aa, 44ab, 44c, and the wiring 44b. The shield groove 44d is embedded in the photosensitive resin layer 21. In other words, the outer side of the shield groove 44d is covered with the photosensitive resin layer 21. The bottom surface of the shield groove 44d is connected to the metal film 12. That is, the shield groove 44d and the metal film 12 are formed in a bottomed cylindrical shape, and the side surfaces and the bottom surfaces of the semiconductor chips 33a, 33b, the wiring photo vias 44aa, 44ab, 44c, and the wiring 44b are covered with the shield groove 44d and the metal film 12. By the shield groove 44d and the metal film 12 are arranged in this way, the semiconductor device 10A can block the electromagnetic noise from the outside and inside, it is possible to improve the reliability.

The via holes 43aa and 43ab exposing the connection part (connection pad) of the semiconductor chips 33a and 33b are formed by selectively irradiating the photosensitive resin with light and dissolving and removing the resin through the developing process. Since the surface on which the connection part of the semiconductor chip 33a is formed and the surface on which the connection part of the semiconductor chip 33b is formed are different from each other in height from the top surface of the photosensitive resin layer 21, the depths of the via holes 43aa and 43ab are different from each other. The aspect ratios of the via holes 43aa and 43b are also different. However, the aspect ratios of the via holes 43aa and 43ab are preferably 1.5 or less. The connection reliability of the wiring photo via 44aa arranged in the via hole 43aa and the wiring photo via 44ab arranged in the via hole 43ab is improved by the aspect ratios of the via holes 43aa and 43ab are 1.5 or less. Since the wiring photo vias 44aa, 44ab are inscribed in the via holes 43aa, 43ab, the aspect ratio of the wiring photo via 44aa, 44ab is substantially the same as the aspect ratio of the via holes 43a, 43b. The via holes 43aa and 43ab are formed in the same process by the method for manufacturing the semiconductor device described above. Assuming that the thickness of the semiconductor chip 33a is 70 μm, the thickness of the semiconductor chip 33b is 50 μm, the thickness of the photosensitive resin layer 21 is 100 μm, the film thickness of the photosensitive resin layer 21 in the region overlapping with the surface on which the connection pad of the semiconductor chip 33a is formed is 30 μm, and the film thickness of the photosensitive resin layer 21 in the region overlapping with the surface on which the connection pad of the semiconductor chip 33b is formed is 50 μm, the aspect ratio of the via hole 43a is 1.0 and the aspect ratio of the via hole 43b is 1.25 in a case where the diameter of the via hole 43a is 30 μm and the diameter of the via hole 43b is 40 μm.

The shield groove 44d is arranged to surround both the two semiconductor chips 33a, 33b, but may be arranged to surround only one or individually. Considering the influence of electromagnetic waves of the semiconductor device 10A, it is easy to design the shield groove 44d according to the influence.

Figure 11:
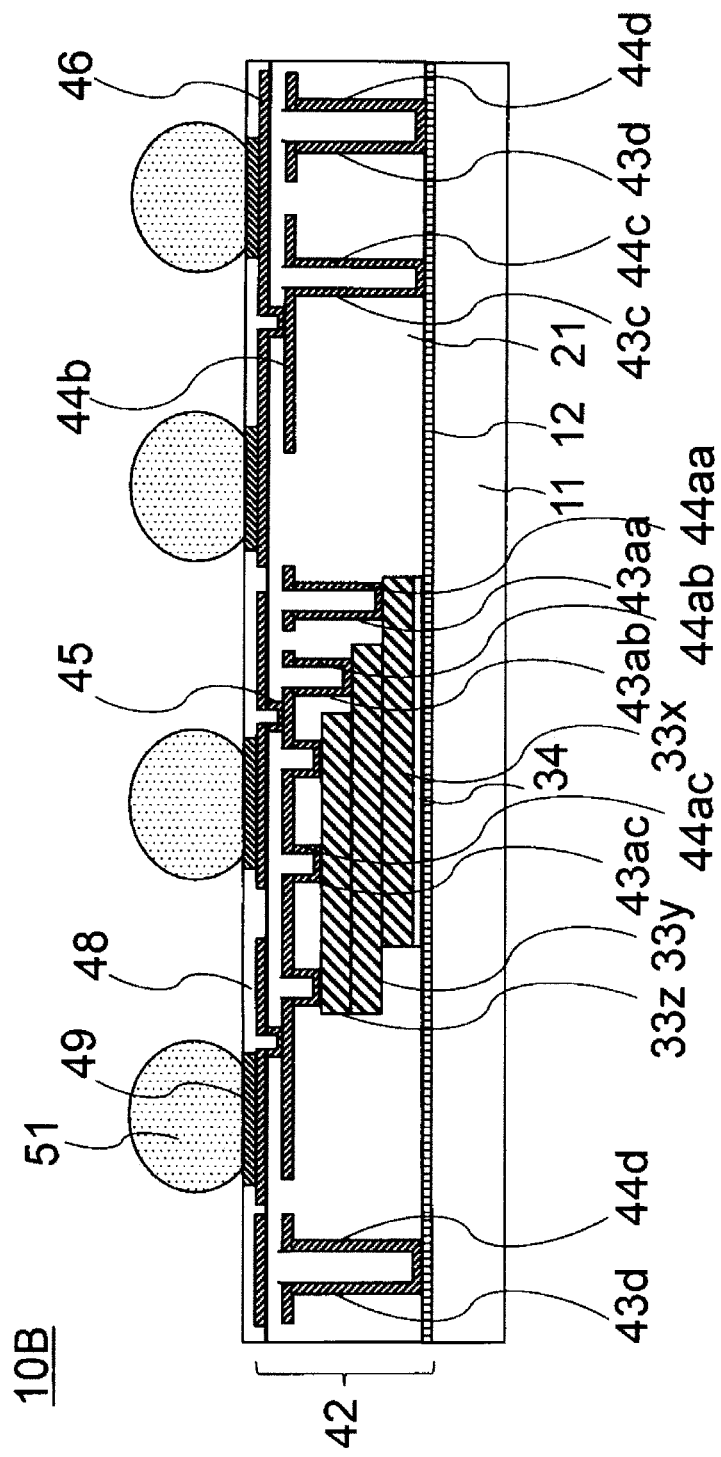
FIG. 11 is a cross-sectional view of a semiconductor device according to an embodiment of the present invention.

In the semiconductor device 10A shown in FIG. 10, a configuration in which each of the semiconductor chips 33a, 33b are arranged side by side on the base substrate 11, respectively. However, the present invention is not limited to this, and as shown in FIG. 11, a semiconductor device 10B may have memory chips 33x and 33y such as a NAND flash memory and a DRAM and a storage controller chip 33z stacked in a staircase pattern on the base substrate. Depending on the requirements of system integration, the memory chips may be further stacked in multiple stages. The reason for stacking in a staircase pattern is that in a case where the chip sizes are approximately the same, the connection pads are not exposed if they are simply stacked so that the connection pads of each chip are exposed. In the case of stacking small-sized chips on the top, they may not be stacked in a staircase pattern if the connection pads are exposed. Semiconductor chips with a large number of connection pads (the storage controller chip 33z in FIG. 11) are placed at the top layer because connecting them with a shallow wiring photo via is superior in speeding up transmission and reducing the risk of disconnection.

The film-like photosensitive resin (dry film) is vacuum laminated to wrap all the memory chips 33x, 33y and the storage controller chip 33z with the resin, and the top surface is planarized by press processing. The vacuum-lamination allows sealing without forming air bubbles in the staircase parts where the connection pads are not provided. As a matter of course, the connection parts of the memory chips 33x and 33y are provided to be arranged at exposed positions.

The thickness of the photosensitive resin layer 21 is 200 μm or less and is 10 μm to 50 μm thicker than the total thickness of the memory chips 33x, 33y and the storage controller chip 33z. The photosensitive resin layer 21 preferably have the film thickness of 5 μm or more and 50 μm or less at the region overlaps with the surface having connection pads of the uppermost chip (in this case, the storage controller chip 33z), in order to reliably enclose the memory chips 33x, 33y and the storage controller chip 33z and to suppress the thickness thereof.

The photosensitive resin layer 21 includes the via holes 43aa, 43ab, and 43ac for exposing the connection parts (connection pads) of each of the memory chips 33x, 33y and the storage controller chip 33z, the via hole 43c arranged around the semiconductor chip 33 for exposing the metal film 12, and the groove 43d for surrounding the memory chips 33x, 33y and the storage controller chip 33z stacked in a staircase pattern in a Face-Up manner and exposing the metal film 12. A metal film made of copper plating is applied to the inside the via holes 43aa, 43ab, 43ac, 43c by a copper plating method, and the wiring photo vias 44aa, 44ab, 44ac, 44c are arranged. A metal film made of copper plating is similarly applied to the inside the groove 43d by a copper plating method and the shield groove 44d is arranged. The photosensitive resin layer 21 is arranged inside the wiring photo vias 44 aa, 44ab, 44ac, 44c and the shield groove 44d. This is because the photosensitive resin is surely filled inside the wiring photo vias 44aa, 44ab, 44ac, 44c, and the shield groove 44d by vacuum-laminating (or by spin-coating or slit-coating) the photosensitive resin in the process of forming the next wiring layer, as in the above-described embodiment.

The aspect ratio of the wiring photo via 44aa is greater than that of the wiring photo via 44ab, and the aspect ratio of the wiring photo via 44ab is greater than that of the wiring photo via 44ac. The wiring photo via 44aa, the wiring photo via 44ab and the wiring photo via 44ac, the wiring photo via 44c and the shield groove 44d, and the wiring 44b are electrically connected. With this configuration, the memory chips 33x, 33y, the storage controller chip 33z, and the rewiring layer 42 are electrically connected via the copper wiring layer 44.

The wiring photo vias 44aa, 44ab, and 44ac are in a position that does not overlap the outer peripheral edge of the memory chips 33x, 33y, and the storage controller chip 33z. The wiring photo via 45 of the rewiring layer 42 is also in a position that does not overlap the outer peripheral edge of the memory chips 33x, 33y, and the storage controller chip 33z. Further, the external connection terminal 49 is preferably positioned so as not to overlap the outer peripheral edge of the memory chips 33x, 33y, and the storage controller chip 33z. The soldering ball 51 is also preferably in a position so as not to overlap the outer peripheral edge of the memory chips 33x, 33y, and the storage controller chip 33z. The outer peripheral edge of the memory chips 33x, 33y, and the storage controller chip 33z indicates all outer peripheral edges arranged in multiple stages that can be confirmed when viewed from above. For this reason, for example, both the wiring photo via 45 and the external connection terminal 49 can be arranged on the outer peripheral edge of a part of the memory chip 33x (left end of the memory chip 33x in FIG. 11) covered by the memory chip 33y and the storage controller chip 33z in the upper stage.

In the embodiment described above, the surface on which the semiconductor chip is fixed is covered with the metal film 12 provided on the base substrate 11 to form a plane-shaped shield structure. In the following embodiments, the shield function is realized by using an antenna structure having a ground layer covering most of the surface on which the semiconductor chip is fixed instead of the metal film 12.

In recent years, in 5G millimeter-wave communication, which is a fifth-generation mobile communication technology, since the antenna size becomes smaller as the frequency becomes higher, it becomes possible to apply an antenna-in-package technology for arranging antenna elements on these packages. In the antenna design of millimeter wave, a plane antenna in which small antenna elements are arranged in an array is used. By arranging this array plane antenna on the package, the antenna can be arranged with good space efficiency. An amplifier circuit and RF circuit in the package can be connected to this antenna with a short feeding wiring. Depending on the wavelength of the target electromagnetic wave, it is also possible to arrange a variety of antennas such as in a loop shape.

Figure 12:
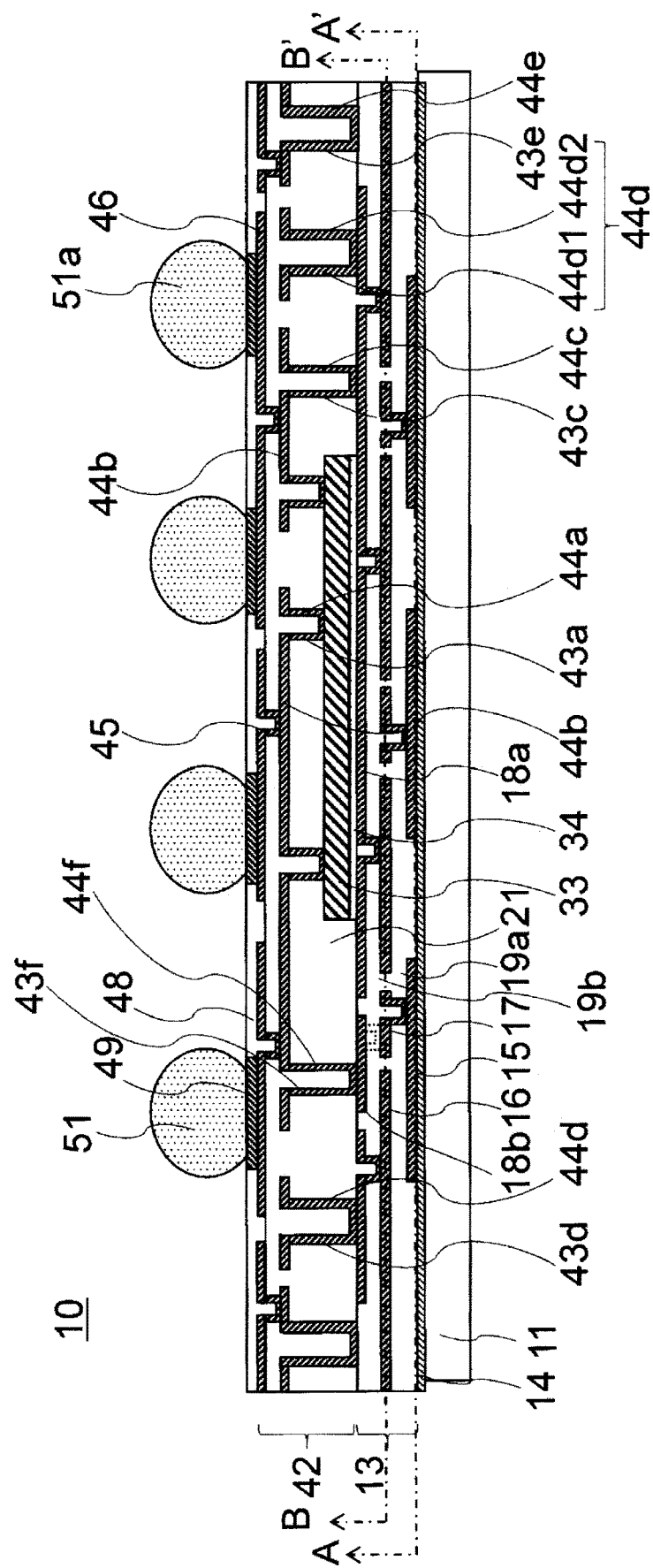
FIG. 12 is a cross-sectional view of a semiconductor device according to an embodiment of the present invention.

FIG. 12 is a cross-sectional view of a semiconductor device which is an electronic circuit device according to another embodiment of the present invention. Numbers same as in FIG. 1 refer to the same elements as in FIG. 1. In the present embodiment, first, a member in which a plate-shaped antenna structure layer 13 in which the width, thickness, area, etc., are dimensioned in advance by the antenna design is stacked on the base substrate 11 via a peeling layer 14 is prepared. In the final stage of the manufacturing process, the base substrate 11 will be removed at the peeling layer 14. The antenna structure layer 13 is obtained by stacking an antenna layer in which a plurality of plane antenna elements (patch antenna) 15 is formed, an insulating layer 19a, a ground layer including a ground wiring 16 arranged to cover substantially the entire surface of the antenna structure layer 13 with being connected to the ground potential, an insulating layer 19b, a wiring pattern layer in which a ground wiring 18a and an antenna feeding wiring 18b are arranged. Since it is less affected by noise when this antenna layer and the ground layer are as close as possible, this point is considered in antenna design. The antenna structure layer 13 is pre-manufactured by laser via processing, metallization processing, resin lamination processing or the like used in the manufacture of general electronic circuit substrates. The insulating layers 19a and 19b are composed of LCP (liquid crystal polymer) and fluorine-based resins, which are low Df/Dk materials used in the radio field. The ground wiring 16, and the insulating layer 19b between the ground wiring 18a and the antenna feeding wiring 18b of the wiring pattern layer may be composed of a general substrate prepreg material such as an epoxy resin or polyimide resin.

A plurality of rectangular patch antennas 15 is arranged in an array on one surface. The shape, dimensions, number, arrangement interval, etc. of the patch antenna 15 are based on the antenna design, for example, it can be designed to dimensions of the short side 18 mm, long side 22 mm in a 5 GHz antenna. Each patch antenna 15 is connected to a feeding wiring 17 of the grounding layers via the wiring photo via, and the feeding wiring 17 is connected to the antenna feeding wiring 18b via another wiring photo via provided in the depth direction of the drawing (shown by only one wiring photo via in dashed lines in the drawing). The antenna feeding wiring 18b is wiring designed so that each of the patch antennas 15 has a predetermined connection arrangement.

The rewiring layer 42 includes simultaneously formed wiring photo vias 44a, 44c, 44f, the shield groove 44d, and a stub functional antenna 44e. These are simultaneously formed by metallization processing after forming the via holes 43a, 43c, the groove 43d, a via hole 43f, 43e at the same time in exposure processing. The bottom of the wiring photo via 44f is connected to the antenna feeding wiring 18b. This connection is performed in the manufacturing process simultaneously with the connection between the wiring photo via 44c, the shield groove 44d and the ground wiring 18a. The wiring photo via 44f is connected to the connection terminal of the semiconductor chip 33, which is an RF element, and the external connection terminal 49 via the wiring 44b and the wiring photo via 44a or the wiring 44b and the wiring photo via 45. However, without being limited thereto, the wiring photo via 44f for antenna feeding may be connected to the RF element installed outside of the semiconductor device 10 directly via the external connection terminal 49 without connecting at all to the connecting terminal of the semiconductor chip 33. In this case, the semiconductor chip 33 may not be an RF element. Although a plan view is not shown, the ground wiring 18a is formed so as to contact the entire bottom surface of the shield groove 44d. The shield groove 44d and the ground wiring 16 form a structure (bottomed cylindrical) in which the semiconductor chip 33 is covered with a metal film, thereby realizing an electromagnetic wave shield function. On the other hand, although not shown, the stub function antenna 44e for improving the antenna performance is connected to the RF element. Since the antenna feeding wiring 18b and the ground wiring 18a are not arranged at the bottom of the stub function antenna 44e, the stub function antenna 44e is not electrically connected directly to the antenna structure layer 13. In FIG. 12, the stub function antenna 44e is formed at both left and right ends. The shape and dimensions, etc. of the stub function antenna 44e are determined by the antenna design.

Figure 13A:
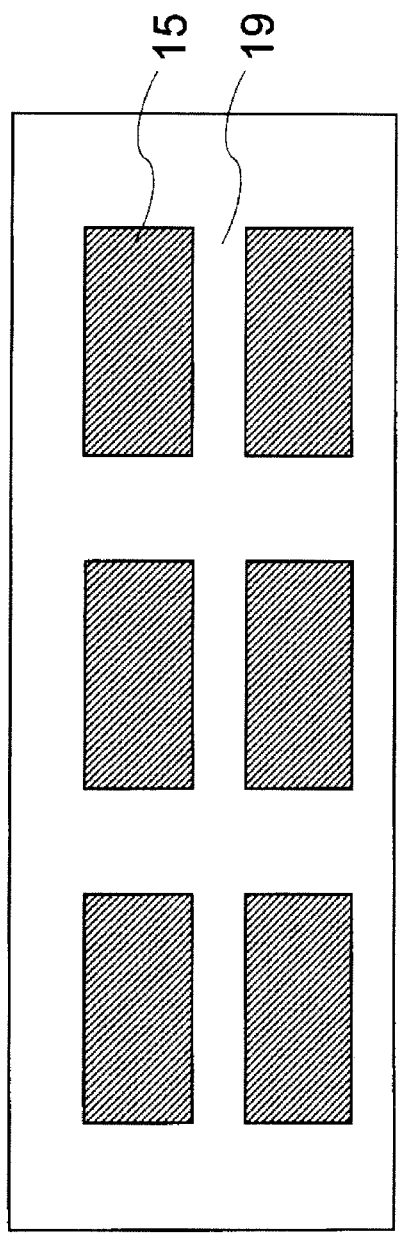
FIG. 13A is a cross-sectional view of a semiconductor device according to an embodiment of the present invention.
Figure 13B:
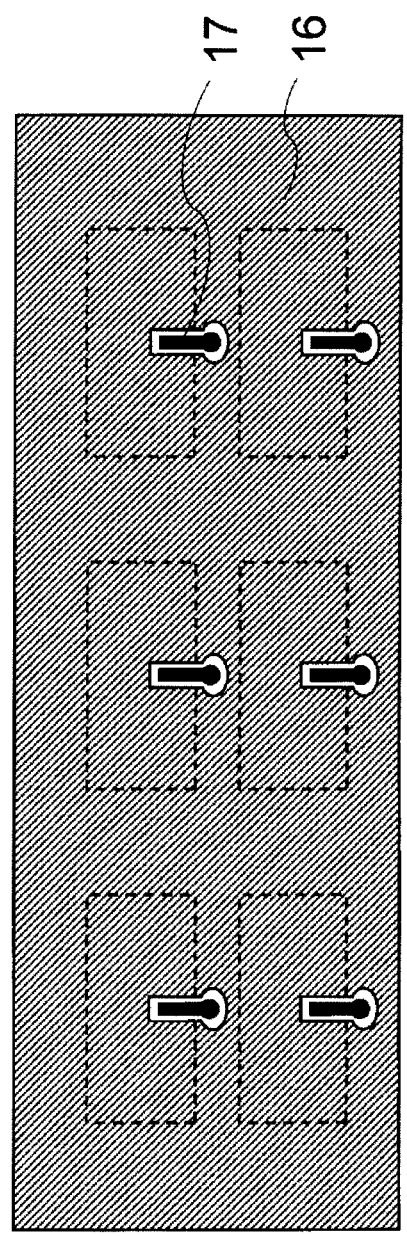
FIG. 13B is a cross-sectional view of a semiconductor device according to an embodiment of the present invention.

FIG. 13A shows an A-A' cross-sectional view showing the structure of the patch antenna of the semiconductor device according to the embodiment of FIG. 12. FIG. 13B shows a B-B' cross-sectional view showing the structure of the ground wiring of the semiconductor device according to the embodiment of FIG. 12. The patch antenna 15 arranged in an array and the ground wiring 16 are shown schematically. The ground wiring 16 is formed in a plane shape and provided with a key-shaped opening (penetrating region) in which the feeding wiring 17 surrounded by an insulating region is arranged. The patch antenna 15 are arranged at a position opposed to the opening. Although there is a plurality of small openings, the ground wiring 16 connected to the ground potential covers almost the entire surface, thereby producing a shielding effect.

Figure 14:
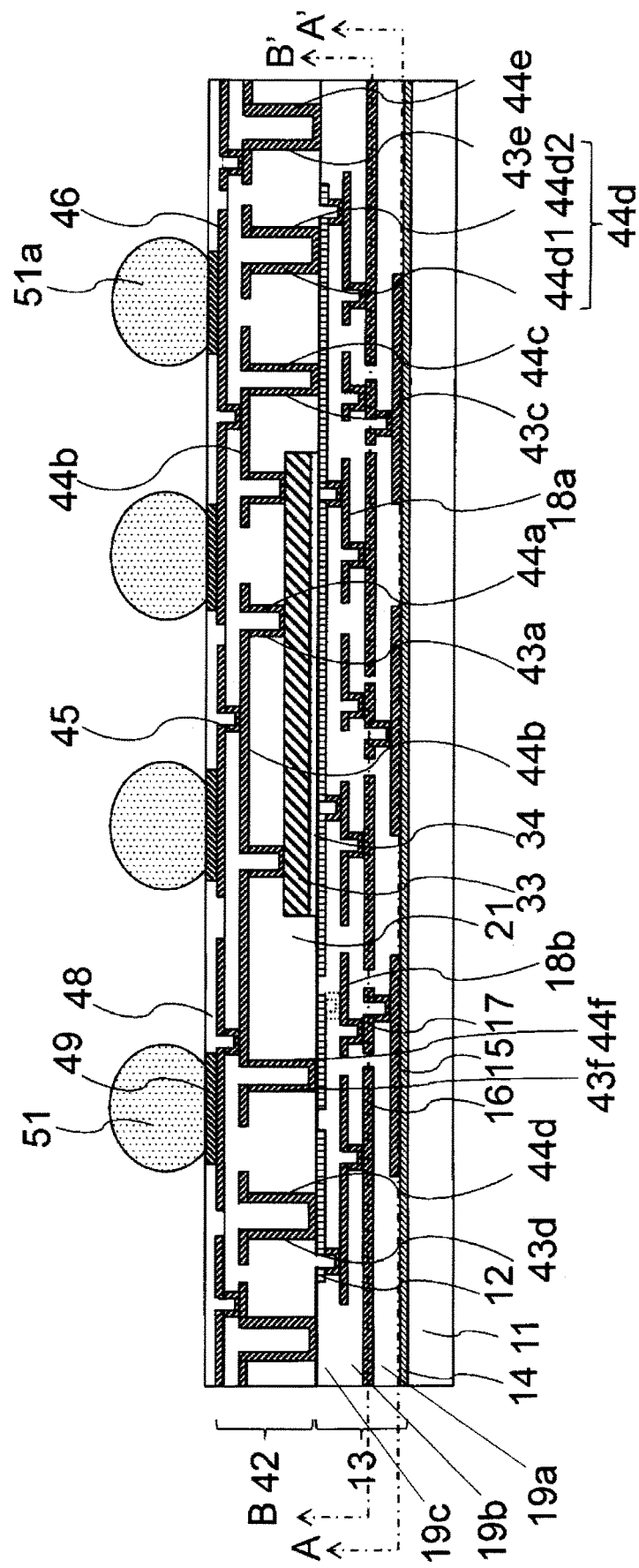
FIG. 14 is a cross-sectional view of a semiconductor device according to an embodiment of the present invention.

FIG. 14 is a cross-sectional view of a semiconductor device which is an electronic circuit device according to another embodiment of the present invention. Numbers same as in FIG. 12 refer to the same elements as in FIG. 12. Difference from the embodiment shown in FIG. 12 is that the metal film 12 connected with the predetermined connecting via through an insulating layer 19c is further stacked on the antenna structure layer 13. The metal film 12 is made of a plane-shaped ground region arranged so as to cover substantially the entire surface of the shield region surrounded by the shield groove 44d and has an opening in which a feeding terminal of a small region to which the wiring photo via 44f for feeding antenna is connected is surrounded by the insulating layer. The ground wiring 16 is provided with a large number of key-shaped opening, but since the metal film 12 connected to the grounding potential needs to have at least one opening, the shielding effect can be further enhanced by the metal film 12. By making a stacked structure that eliminates the ground wiring 18a, disconnects the metal film 12 and the ground wiring 16, connects the metal film 12 to the digital ground potential and connects the ground wiring 16 to the analog ground potential, it may be connected to the outside in a two-system ground path. This is useful for antenna designs that consider the effects of noise on digital wiring paths.

Figure 15A:
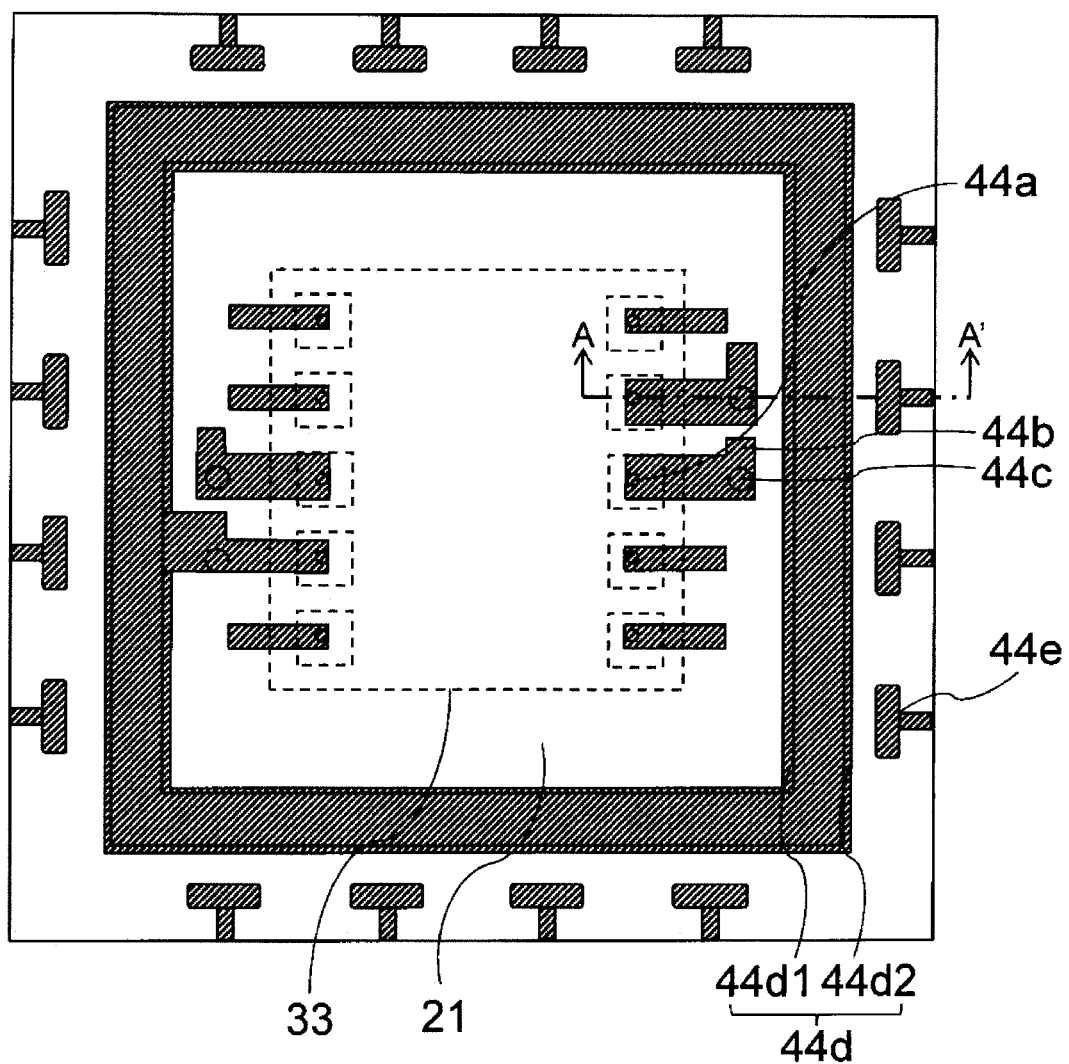
FIG. 15A is a top view showing a method for manufacturing a semiconductor device according to an embodiment of the present invention.
Figure 15B:
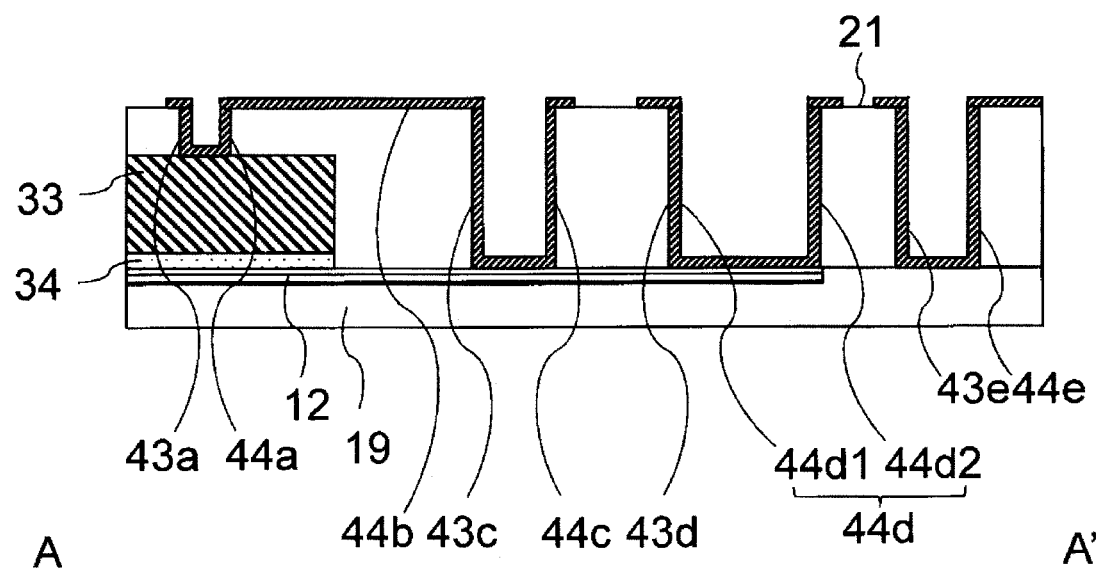
FIG. 15B is an enlarged cross-sectional view showing a method for manufacturing a semiconductor device according to an embodiment of the present invention.
Figure 16:
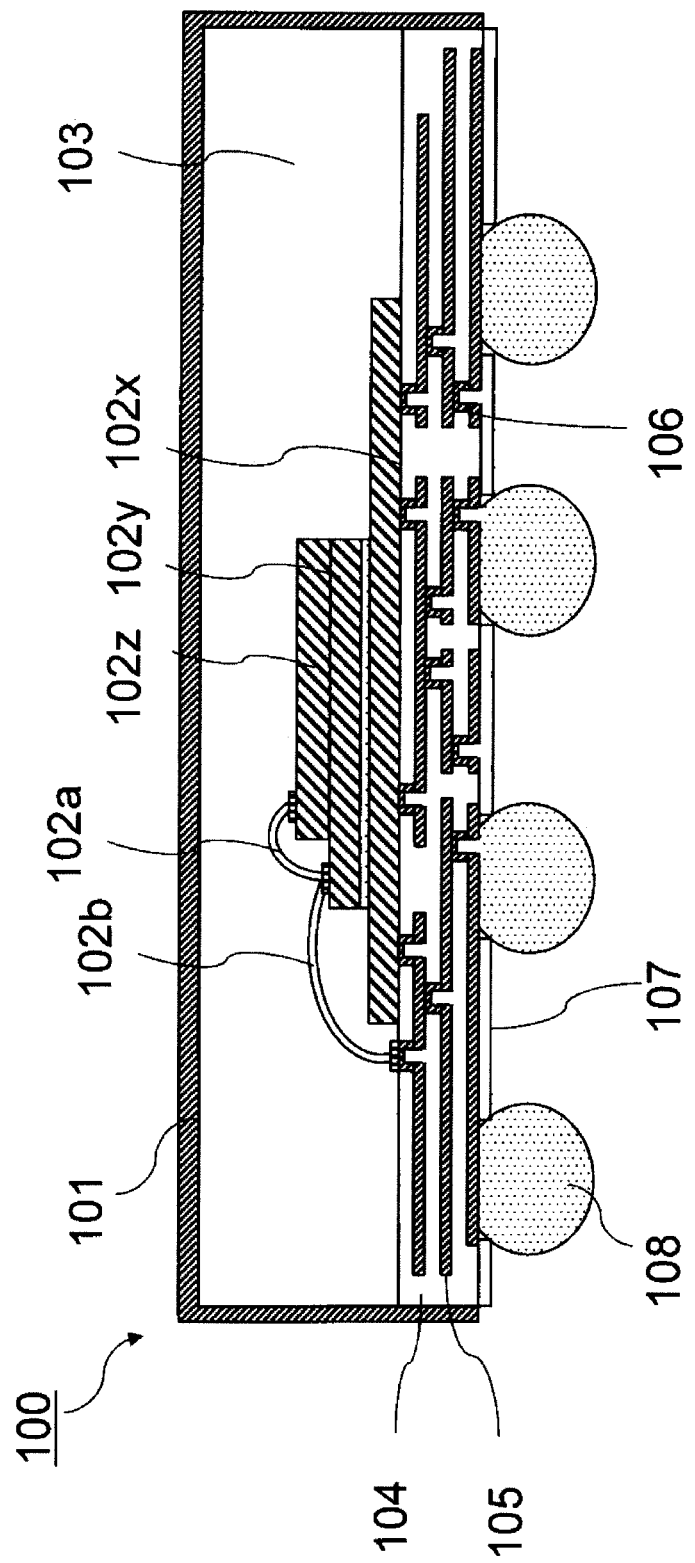
FIG. 16 is a cross-sectional view of a conventional MCP.

FIGS. 15A and 15B is a diagram showing a structure of the stub function antenna 44e of the embodiment shown in FIGS. 12 and 14. FIG. 15A is a plan view schematically showing the wiring pattern of the upper layer of the rewiring layer 42, and FIG. 15B indicates a cross-sectional view of A-A'. The stub function antenna 44e is a plurality of rectangular photo vias arranged parallel to each side of the outer periphery of the rectangular shield groove 44d in a band shape, dimensions and arrangement and the like are determined by the antenna design.

The present invention is not limited to the above-described embodiments and modifications, and can be appropriately modified within a range not departing from the spirit thereof. The embodiments and modifications can be appropriately combined.

Although the application processor chip and DRAM or the flash memory are three-dimensionally mounted in the embodiment of the present invention, the electronic circuit element is not limited to this, and may be another logical LSI or memory element instead of the application processor chip, or may be another memory element or logic LSI, discrete, analogue, or RF element instead of DRAM or flash memory. These electronic circuit elements need not be limited to a semiconductor device, it may be an element that can be various components of an electronic circuit such as a passive element, sensor element, magnetic device, and antenna and the like.

The present invention is possible to realize while ensuring inexpensive and reliable electronic circuit device having an electromagnetic wave shield structure by using a FOWLP structure suitable for system integration of the semiconductor chip.

What is claimed is:

1. An electronic circuit device comprising:
a plane-shaped shield member having conductivity;
at least one electronic circuit element having a first surface opposed to a second surface on which a connecting part is formed, the first surface arranged on the plane-shaped shield member; and
a rewiring layer comprising
an insulating photosensitive resin layer enclosing the electronic circuit element on the plane-shaped shield member;
a plurality of wiring photo vias made from a plurality of first conductors electrically connected to a connecting part of the electronic circuit element, a wiring made from a second conductor electrically connected to each of the plurality of wiring photo vias on a same surface parallel to the plane-shaped shield member, and a wall-shaped shield groove made from a third conductor for a sealing arranged to continuously surround a thickness direction of the electronic circuit element, wherein the photosensitive resin layer is filled inside the wall-shaped shield groove, and the plane-shaped shield member and the wall-shaped groove are electrically connected to provide an electromagnetic wave shield structure that surrounds the electronic circuit element.

2. The electronic circuit device according to claim 1, wherein the plane-shaped shield member includes a substrate on which a metal film is formed on a surface, and the electronic circuit element is fixed on the metal film.

3. He electronic circuit device according to claim 2, wherein corner parts of the outer shape of the wall-shaped shield groove are curved.

4. The electronic circuit device according to claim 2, wherein at least one grounding wiring photo via in which the photosensitive resin layer is filled inside like the wall-shaped shield groove and electrically connected to the plane-shaped shield member is arranged between the outer periphery of the electronic circuit element and the wall-shaped shield groove, and a grounding line of the wiring and the metal film are electrically connected via the grounding wiring photo via.

5. He electronic circuit device according to claim 2, wherein the grounding line of the wiring is electrically directly connected to the wall-shaped shield groove.

6. The electronic circuit device according to claim 1, wherein the plane-shaped shield member consists of a metal material to which the electronic circuit element is fixed on a surface.

7. An electronic circuit device comprising:

a plane-shaped shield member having conductivity;

at least one electronic circuit element having a first surface opposed to a second surface on which a connecting part is formed, the first surface arranged on the plane-shaped shield member; and a rewiring layer comprising an insulating photosensitive resin layer enclosing the electronic circuit element on the plane-shaped shield member;

a plurality of wiring photo vias made from a plurality of first conductors electrically connected to a connecting part of the electronic circuit element, a wiring made from a second conductor electrically connected to each of the plurality of wiring photo vias on a same surface parallel to the plane-shaped shield member, a wall-shaped shield groove made from a third conductor for a sealing arranged to surround a thickness direction of the electronic circuit element, and an additional electronic circuit element different in thickness from the electronic circuit element, wherein the plane-shaped shield member includes a substrate on which a metal film is formed on a surface, the electronic circuit element is fixed on the metal film, the plane-shaped shield member and the wall-shaped groove are electrically connected to provide an electromagnetic wave shield structure that surrounds the electronic circuit element, the additional electronic circuit element is fixed side by side with the electronic circuit element so as to expose a connecting part on a third surface opposed to the metal film, and the rewiring layer includes a plurality of additional wiring photo vias different in depth from the plurality of wiring photo vias, the plurality of additional wiring photo vias directly connected to the connecting part of the additional electronic circuit element.

8. An electronic circuit device comprising:

a plane-shaped shield member having conductivity;

at least one electronic circuit element having a first surface opposed to a second surface on which a connecting part is formed, the first surface arranged on the plane-shaped shield member; and a rewiring layer comprising an insulating photosensitive resin layer enclosing the electronic circuit element on the plane-shaped shield member;

a plurality of wiring photo vias made from a plurality of first conductors electrically connected to a connecting part of the electronic circuit element, a wiring made from a second conductor electrically connected to each of the plurality of wiring photo vias on a same surface parallel to the plane-shaped shield member, a wall-shaped shield groove made from a third conductor for a sealing arranged to surround a thickness direction of the electronic circuit element, and an additional electronic circuit element, wherein the plane-shaped shield member includes a substrate on which a metal film is formed on a surface, the electronic circuit element is fixed on the metal film, the plane-shaped shield member and the wall-shaped groove are electrically connected to provide an electromagnetic wave shield structure that surrounds the electronic circuit element, the additional electronic circuit element is stacked in steps on the electronic circuit element so as to expose the connecting part of the electronic circuit element, and the rewiring layer includes a plurality of additional wiring photo vias different in depth from the plurality of wiring photo vias, the plurality of additional wiring photo vias directly connected to a connecting part of the additional plurality of electronic circuit element.

9. An electronic circuit device comprising:

a plane-shaped shield member having conductivity;

at least one electronic circuit element having a first surface opposed to a second surface on which a connecting part is formed, the first surface arranged on the plane-shaped shield member; and a rewiring layer comprising an insulating photosensitive resin layer enclosing the electronic circuit element on the plane-shaped shield member;

a plurality of wiring photo vias made from a plurality of first conductors electrically connected to a connecting part of the electronic circuit element, a wiring made from a second conductor electrically connected to each of the plurality of wiring photo vias on a same surface parallel to the plane-shaped shield member, and a wall-shaped shield groove made from a third conductor for a sealing arranged to surround a thickness direction of the electronic circuit element, wherein the plane-shaped shield member and the wall-shaped groove are electrically connected to provide an electromagnetic wave shield structure that surrounds the electronic circuit element, the rewiring layer further includes an antenna feeding photo via electrically connected to the wiring; and the plane-shaped shield member has a stacked structure including an antenna element layer on which a conductive plane antenna element is formed, a first insulating layer, a plane-shaped conductive grounding layer with an insulating penetration region being arranged at a predetermined position, a second insulating layer, and a wiring pattern layer in which a feeding region where the bottom part of the antenna photo via being electrically connected and a shield connecting region where the bottom part of the wall-shaped shield groove being electrically connected are arranged in an insulated state, wherein a feeding line for electrically connecting the plane antenna element and the feeding region of the wiring pattern layer is arranged in the first insulating layer and the second insulating layer; and a grounding line for electrically connecting the grounding layer and the shield connecting region of the wiring pattern layer is arranged in the second insulating layer.

10. The electronic circuit device according to claim 9, wherein the photosensitive resin layer is filled inside the wall-shaped shield groove.

11. The electronic circuit device according to claim 9, wherein corner parts of the outer shape of the wall-shaped shield groove are curved.

12. The electronic circuit device according to claim 9, wherein at least one grounding wiring photo via in which the photosensitive resin layer is filled inside like the wall-shaped shield groove and electrically connected to the grounding layer of the plane-shaped shield member is arranged between the outer periphery of the electronic circuit element and the wall-shaped shield groove, and the grounding line of the wiring and the grounding layer are electrically connected via the grounding wiring photo via.

13. The electronic circuit device according to claim 9, wherein the grounding line of the wiring is electrically directly connected to the wall-shaped shield groove.

14. The electronic circuit device according to claim 9, further comprising an additional electronic circuit element different in thickness from the electronic circuit element, wherein the additional electronic circuit element is fixed side by side with the electronic circuit element so as to expose a connecting part on a third surface opposed to the plane-shaped shield member, and the rewiring layer includes a plurality of additional wiring photo vias different in depth from the plurality of wiring photo vias, the plurality of additional wiring photo vias directly connected to the connecting part of the additional electronic circuit elements.

15. The electronic circuit device according to claim 9, wherein at least the first insulating layer is made of a low Df/Dk material.

16. The electronic circuit device according to claim 9, wherein the antenna feeding photo via of the rewiring layer is arranged between the electronic circuit element and the wall-shaped shield groove.

17. The electronic circuit device according to claim 9, wherein a stab function antenna including photo vias is further arranged outside the wall-shaped shield groove.

18. An electronic circuit device comprising:

a plane-shaped shield member having conductivity;

at least one electronic circuit element having a first surface opposed to a second surface on which a connecting part is formed, the first surface arranged on the plane-shaped shield member; and a rewiring layer comprising an insulating photosensitive resin layer enclosing the electronic circuit element on the plane-shaped shield member;

a plurality of wiring photo vias made from a plurality of first conductors electrically connected to a connecting part of the electronic circuit element, a wiring made from a second conductor electrically connected to each of the plurality of wiring photo vias on a same surface parallel to the plane-shaped shield member, and a wall-shaped shield groove made from a third conductor for a sealing arranged to surround a thickness direction of the electronic circuit element, wherein the plane-shaped shield member and the wall-shaped groove are electrically connected to provide an electromagnetic wave shield structure that surrounds the electronic circuit element, the rewiring layer further includes an antenna feeding photo via electrically connected to the wiring; and the plane-shaped shield member has a stacked structure including an antenna element layer on which a conductive plane antenna element is formed, a first insulating layer, a plane-shaped conductive grounding layer with an insulating penetration region being arranged at a predetermined position, a second insulating layer, and a wiring pattern layer having a first antenna feeding terminal and a second antenna feeding terminal electrically connected to each other, a third insulating layer, and a metal layer having an external feeding terminal surrounded by an insulating region and the bottom part of the antenna feeding photo via is connected, and the bottom part of the wall-shaped shield groove of the rewiring layer is electrically connected, wherein a first feeding line for electrically connecting the plane antenna element and the first antenna feeding terminal of the wiring pattern layer via the penetration region of the grounding layer is arranged in the first insulating layer and the second insulating layer; and
a second feeding line for electrically connecting the second antenna feeding terminal of the wiring pattern layer and the external feeding terminal of the metal layer is arranged in the third insulating layer; and
a grounding line for electrically connecting the grounding layer and the metal layer is arranged in the second insulating layer and the third insulating layer.

\* \* \* \* \*